(12) United States Patent
Nozaki et al.

(10) Patent No.: US 7,358,728 B2
(45) Date of Patent: Apr. 15, 2008

(54) MAGNETIC RESONANCE IMAGING APPARATUS AND MAGNETIC RESONANCE IMAGING DATA PROCESSING METHOD

(75) Inventors: Seiji Nozaki, Otawara (JP); Yoshimori Kassai, Nasushiobara (JP)

(73) Assignees: Kabushiki Kaisha Toshiba, Tokyo (JP); Toshiba Medical Systems Corporation, Otawara-shi, Tochigi-Ken (JP)

( * ) Notice: Subject to any disclaimer, the term of this patent is extended or adjusted under 35 U.S.C. 154(b) by 0 days.

(21) Appl. No.: 11/086,204

(22) Filed: Mar. 23, 2005

(65) Prior Publication Data

US 2005/0270025 A1 Dec. 8, 2005

(30) Foreign Application Priority Data

Mar. 24, 2004 (JP) .............................. 2004-086701

(51) Int. Cl.
*G01V 3/00* (2006.01)
(52) U.S. Cl. ....................... 324/307; 324/309
(58) Field of Classification Search ................ 324/307, 324/309, 300
See application file for complete search history.

(56) References Cited

U.S. PATENT DOCUMENTS

| | | | | |
|---|---|---|---|---|
| 4,823,085 A | * | 4/1989 | Fuderer et al. | 324/312 |
| 4,825,162 A | * | 4/1989 | Roemer et al. | 324/318 |
| 5,289,127 A | * | 2/1994 | Doddrell et al. | 324/314 |
| 5,345,178 A | * | 9/1994 | Manabe et al. | 324/320 |
| 5,378,985 A | * | 1/1995 | Hinks | 324/309 |
| 5,498,963 A | * | 3/1996 | Schneider et al. | 324/309 |
| 6,239,599 B1 | * | 5/2001 | Zhou et al. | 324/309 |
| 6,259,250 B1 | * | 7/2001 | Mock | 324/309 |
| 6,294,913 B1 | * | 9/2001 | Hinks et al. | 324/309 |
| 6,369,568 B1 | * | 4/2002 | Ma et al. | 324/309 |
| 6,466,015 B2 | * | 10/2002 | Schaeffter et al. | 324/309 |
| 6,507,190 B1 | * | 1/2003 | Hinks et al. | 324/307 |
| 6,529,001 B2 | * | 3/2003 | Mock | 324/309 |
| 6,566,875 B1 | * | 5/2003 | Hasson et al. | 324/309 |
| 2004/0245986 A1 | * | 12/2004 | Kumai et al. | 324/307 |

FOREIGN PATENT DOCUMENTS

| | | |
|---|---|---|
| JP | 2001-190519 | 7/2001 |
| JP | 2003-135423 | 5/2003 |

OTHER PUBLICATIONS

The Mathworks, Inc. "Image Processing Toolbox For Use with MATLAB User's Guide, Version 2", Jan. 1999.*

* cited by examiner

*Primary Examiner*—Brij Shrivastav
*Assistant Examiner*—Megann E Vaughn
(74) *Attorney, Agent, or Firm*—Nixon & Vanderhye P.C.

(57) ABSTRACT

A magnetic resonance imaging apparatus 20 includes a phase difference calculation unit 44 configured to perform a one-dimensional Fourier transform on complex data not phase-encoded extracted from complex data of a nuclear resonant signal collected by dynamic scanning, and determining a phase difference in time of data obtained by performing a one-dimensional Fourier transform on the complex data not phase-encoded, and a correction unit 50, 51 configured to correct for a non-uniformity of static magnetic field caused during the dynamic scanning, depending upon the phase difference.

38 Claims, 9 Drawing Sheets

MAGNETIC RESONANCE IMAGING APPARATUS AND MAGNETIC RESONANCE IMAGING DATA PROCESSING METHOD

CROSS REFERENCES TO RELATED APPLICATIONS

The present application relates to and incorporates by reference Japanese Patent application No. 2004-086701 filed on Mar. 24, 2004.

BACKGROUND OF THE INVENTION

1. Technical Field of the Invention

The present invention relates to a magnetic resonance imaging apparatus and magnetic resonance imaging data processing method that can reduce positional shift of tomographic image, poor fat suppression, etc. caused by a shift in the spatial distribution of intensity (preferably uniform) of static magnetic field $B_o$ as it varies with temperature variation of a thermally coupled gradient magnetic field coil unit.

2. Description of the Related Art

Conventionally, it is a practice to use a magnetic resonance imaging (MRI) apparatus 1 as shown in FIG. 15 (see JP-A-2002-85369, for example), as a monitoring apparatus at the medical site.

An MRI apparatus 1 has a static-magnetic-field magnet 2 cylindrical in form for forming a static magnetic field within which can be laid an examination subject P having an imaging region where a gradient magnetic field is formed in directions of X, Y and Z axes by means of gradient magnetic field coils $3x$, $3y$, $3z$ of a gradient magnetic field coil unit 3 so that magnetic resonance can be caused with the nuclear spin within the examination subject P by transmitting an RF (radio frequency) signal from an RF coil 4. By utilizing a nuclear magnetic resonant signal (NMR) caused by excitation, an image can be reconstructed as to the examination subject P.

Namely, a static magnetic field is formed within the static-magnetic-field magnet 2 by a static-magnetic-field power supply 5. Furthermore, according to an instruction from an input device 6, a sequence-controller control unit 7 provides a sequence, as signal control information, to a sequence controller 8. The sequence controller 8 in turns controls a gradient magnetic field power supply 9 connected to the gradient magnetic field coils $3x$, $3y$, $3z$ and a transmitter 10 for providing an RF signal to the RF coil 4, according to a sequence. Due to this, a gradient magnetic field is formed at the imaging region so that an RF signal can be transmitted to the examination subject P.

In this case, the X-axis gradient magnetic field, the Y-axis gradient magnetic field and the Z-axis gradient magnetic field, formed by the gradient magnetic field coils $3x$, $3y$, $3z$, are used mainly as a magnetic field for phase encoding (PE), a magnetic field for readout (RO) and a magnetic field for slice selection (SL), respectively. For this reason, the X, Y and Z coordinates, defining nuclear positional information, are respectively converted into a phase, a frequency and a slice region of nuclear spin.

The NMR signal, caused by an excitation of nuclear spin at the interior of the examination subject P, is received at the RE coil 4 and provided to a receiver 11 where it is digitized and converted into raw data. Furthermore, the raw data is taken in the sequence-controller control unit 7 through the sequence control 8. The sequence-controller control unit 7 through the sequence control 8. The sequence-controller control unit 7 arranges the raw data in k-space (Fourier space) formed in a raw-data database 12. Then, an image reconstruction unit 13 performs a Fourier transform on the raw data arranged in the k-space and provides it to a display device 14 to make a display, thereby reconstructing an image of examination subject P.

For such MRI apparatuses 1, there is a recent attempt to increase the imaging rate by forming a intense gradient magnetic field at increased rate. The representative approaches of high-speed imaging based on the MRI apparatuses 1 include a known scheme of EPI (echo planer imaging) capable of acquiring a plurality of echoes by one excitation. In the EPI scheme of imaging, the gradient magnetic field power supply 9 and the transmitter 10 are controlled by the sequence controller 8 according to an EPI sequence set up based on the EPI scheme.

In the case of imaging according to an EPI sequence, a PE gradient magnetic field is formed with high intensity by providing high power electrical current to the gradient-magnetic-field coil unit 3 in order to improve-The frequency resolution in the direction of PE gradient magnetic field.

However, in the case of imaging according to the usual EPI scheme, there is a problem of the influence of magnetic field non-uniformity with the result of deteriorated image quality. To avoid this, a current is supplied from a shim-coil power supply 16 to a cylindrical shim coil 15 provided coaxially to and inward of a magnet forming the static magnetic field, thereby making the static magnetic field uniform.

Conventionally, a ferrous shim is inserted in the gradient magnetic field coil $3x$, $3y$, $3z$ of the MRI apparatus 1 in order to correct for non-uniformity of static magnetic field. However, when the sequence is continuously executed in order to carry out dynamic image scanning at successive points in time of the examination subject P, heat is generated on the gradient-magnetic-field coil $3x$, $3y$, $3z$ to thereby raise its temperature with the passage of image-taking time. Consequently, the heat from the gradient-magnetic-field coil $3x$, $3y$, $3z$ conducts to the ferrous shim, thus raising the temperature of the ferrous shim and lowering the magnetic permeability of the gradient-magnetic-field coil $3x$, $3y$, $3z$. This causes so-called a $B_o$ shift in that the magnetic flux density passing through the ferrous shim decreases to make spatially non-uniform the static magnetic field, i.e. magnetic flux density at the imaging region. The $B_o$ shift, while predominant in the zero order component, also causes higher-order components.

Furthermore, according to the Larmor formula, the resonant frequency of the MNR signal is proportional to magnetic field intensity. Thus, resonant frequency is varied by a $B_o$ shift raising such problems as shifting the apparent position of a tomographic image obtained by reconstruction and deteriorating image quality due to a deformed tomographic image. Particularly, in a forced load test, there arises a case that resonant frequency can vary by 100 Hz or more.

Meanwhile, there are conventional cases pointing out the problem that it is not sufficient to suppress (fat suppression) of an NMR signal caused by fat molecules.

Such a positional shift of tomographic image and poor fat suppression caused by a BO shift is to appear conspicuously in such a case as performing a dynamic scanning consuming power over a long time (10 minutes or longer) as encountered particularly in an EPI sequence. Furthermore, there is a recent tendency for the problem of BO shift to becomes more conspicuous because of the execution of a long-time imaging of an FE-EPI scheme using an EPI scheme together with an FE (field echo) scheme that causes an NMR signal by inverting the gradient magnetic field.

Recently, there is a dissemination of the multi-channel phased-array coil structured with a plurality of coils. Where the phased-array coil is employed as an RF coil 4, the RF coil 4 has a sensitivity varying from channel to channel in accordance with the spatial distribution of a B0 shift. This raises a problem of causing a variation between the correction values for correcting the sensitivities on the channels of the RF coil 4 because of correspondence with the sensitivity distribution on the RF coil 4.

Meanwhile, the gradient-magnetic-field coil unit 3 constitutes a major source of noise generation in the MRI apparatus 1. Utilized is an MRI apparatus 1 having a silencer mechanism utilizing a vacuum technique in the gradient-magnetic-field coil 3x, 3y, 3z of the gradient magnetic field coil unit 3. When the vacuum degree in the silencer mechanism changes, a phenomenon occurs that is similar to the case of temperature rise on the ferrous shim.

For this reason, considerations have been made on possible corrective measures including a method to remove the ferrous shim from the magnetic field coil 3x, 3y, 3z, a method to provide a cooling function so as not to raise the temperature of the ferrous shim, and so on. However, such approaches lead to cost increase.

Besides, there are differences in the effect of temperature rise of ferrous shim upon an image between MRI apparatuses 1 in accordance with the use amount and layout of a ferrous shim. This makes countermeasures further difficult.

SUMMARY OF THE INVENTION

The present invention has been made in order to cope with the conventional circumstances, and it is an object of the present invention to provide a magnetic resonance imaging apparatus and magnetic resonance imaging data processing method that can reduce the effect upon a positional shift of tomographic image, poor fat suppression, etc. due to a B0 shift without greatly modifying the hardware such as a ferrous shim.

A magnetic resonance imaging apparatus according to an exemplary embodiment of the invention comprises: a phase difference calculation unit configured to perform a one-dimensional Fourier transform on complex data not phase-encoded but extracted from complex data of a nuclear resonant signal collected by dynamic scanning, and determining a phase difference in time of data obtained by performing a one-dimensional Fourier transform on the complex data not phase-encoded; and a correction unit configured to correct for a non-uniformity of static magnetic field caused during the dynamic scanning, depending upon the determined phase difference.

A magnetic resonance imaging apparatus according to an exemplary embodiment of the invention comprises: a phase difference calculation unit configured to perform a one-dimensional Fourier transform on complex data not phase-encoded extracted from complex data of a nuclear resonant signal collected by dynamic scanning, and determining a phase difference in time of data obtained by performing a one-dimensional Fourier transform on the complex data not phase-encoded; and an image position shift unit configured to correct for a position of an image depending upon the phase difference.

A magnetic resonance imaging apparatus according to an exemplary embodiment of the invention comprises: a phase difference calculation unit configured to perform a one-dimensional Fourier transform on complex data not phase-encoded extracted from complex data of a nuclear resonant signal collected by dynamic scanning, and determining a phase difference in time of data obtained by performing the one-dimensional Fourier transform on the complex data not phase-encoded; and a resonant frequency correction unit for determining a frequency shift amount from a value obtained based on the phase difference and shifting a frequency of an RF signal to be transmitted from the RF coil.

A magnetic resonance imaging data processing method according to an exemplary embodiment of the invention comprises: a step of performing a one-dimensional Fourier transform on complex data not phase-encoded extracted from complex data of a nuclear magnetic resonant signal collected by dynamic scanning; a step of determining a phase difference in time of data obtained by performing a one-dimensional Fourier transform on complex data not phase-encoded; and a step of correcting for a non-uniformity of static magnetic field caused during the dynamic scanning, depending upon the phase difference.

A magnetic resonance imaging data processing method according to an exemplary embodiment of the invention comprises: a step of performing a one-dimensional Fourier transform on complex data not phase-encoded extracted from complex data of a nuclear magnetic resonant signal collected by dynamic scanning; a step of determining a phase difference in time of data obtained by performing a one-dimensional Fourier transform on complex data not phase-encoded; and a step of correcting for a position of an image depending upon the phase difference.

A magnetic resonance imaging data processing method according to an exemplary embodiment of the invention comprises: a step of performing a one-dimensional Fourier transform on complex data not phase-encoded extracted from complex data of a nuclear magnetic resonant signal collected by dynamic scanning; a step of determining a phase difference in time of data obtained by performing a one-dimensional Fourier transform of complex data not phase-encoded; a step of determining a frequency shift amount from a value obtained based on the phase difference; a step of determining a correction amount for a frequency of an RF signal to be transmitted from the RF coil depending upon a determined frequency shift amount; and a step of correction sequence information depending upon a determined frequency correction amount of RF signal.

In the magnetic resonance imaging apparatus and magnetic resonance imaging data processing method according to an exemplary embodiment of the invention, it is possible to reduce the effect upon a positional shift of tomographic image, poor fat suppression, etc. due to a B0 shift without greatly modifying the hardware such as a ferrous shim.

DETAILED DESCRIPTION OF THE PREFERRED EMBODIMENT

With reference to the drawings, description will be made on an exemplary embodiment of a magnetic resonance imaging apparatus and magnetic resonance imaging data processing method according to an exemplary embodiment of the present invention.

Figure 1:
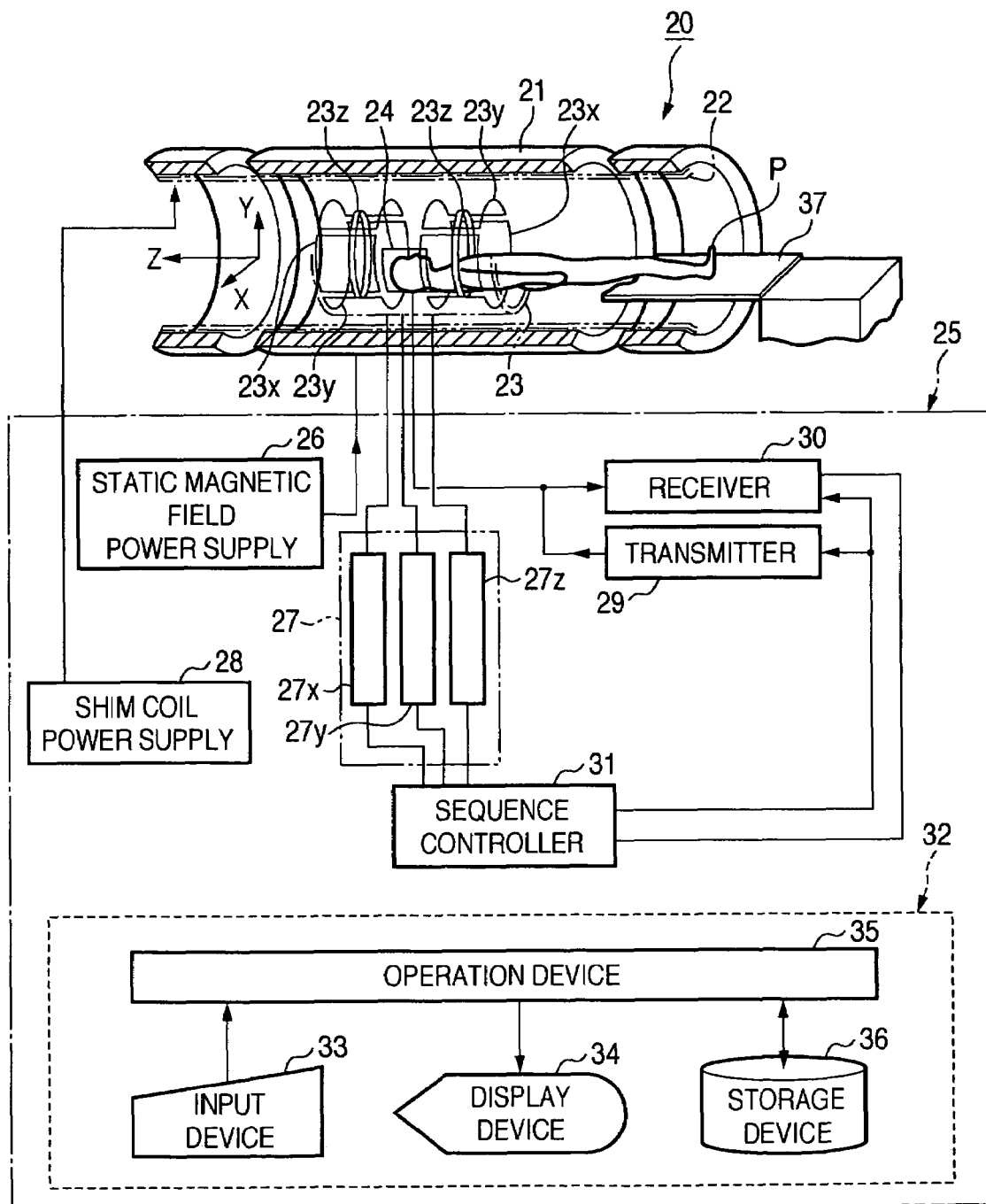
FIG. 1 is an arrangement diagram illustrating a magnetic resonance imaging apparatus according to an exemplary embodiment of the present invention.

FIG. 1 is an arrangement diagram illustrating a magnetic resonance imaging apparatus according to an exemplary embodiment of the invention.

A magnetic resonance imaging apparatus 20 is constructed with a gantry, not shown, incorporating therein a static-magnetic-field magnet 21 cylindrical in form for forming a static magnetic field, a shim coil 22 provided at the inside of the static-magnetic-field magnet 21, a gradient-magnetic-field coil magnet 23 and an RF coil 24.

Meanwhile, the magnetic resonance imaging apparatus 20 has a control system 25. The control system 25 includes a static-magnetic-field power supply 26, a gradient-magnetic-field power supply 27, a shim-coil power supply 28, a transmitter 29, a receiver 30, a sequence controller 31 and a computer 32. The gradient-magnetic-field power supply 27 of the control system 25 is configured with an X-axis gradient-magnetic-field power supply 27x, a Y-axis gradient-magnetic-field power supply 27y and a Z-axis gradient-magnetic-field power supply 27z. Meanwhile, the computer 32 has an input device 33, a display device 34, an operation device 35 and a storage device 36.

The static-magnetic-field magnet 21, connected to the static-magnetic-field power supply 26, serves to form a static magnetic field at an imaging region by means of a current supplied from the static-magnetic-field power supply 26. Incidentally, the static-magnetic-field magnet 21, in frequent cases, is structured by a superconductive coil so that, during excitation, it can be connected to the static-magnetic-field power supply 26 and supplied with a current. However, after once excitation, it generally is placed in a non-connected state. Meanwhile, in some cases, the static-magnetic-field magnet 21 is structured by a permanent magnet to omit the provision of a static-magnetic-field power supply 26.

Meanwhile, a cylindrical shim coil 22 is provided at the inside of and coaxially to the static-magnetic-field magnet 21. The shim coil 22, connected to the shim-coil power supply 28, is structured to make the static magnetic field uniform by supplying a current from the shim-coil power supply 28 to the shim coil 22.

The gradient-magnetic-field coil unit 23 is structured with an X-axis gradient-magnetic-field coil 23x, a Y-axis gradient-magnetic-field coil 23y and a Z-axis gradient-magnetic-field coil 23z, and formed cylindrical in form at the inside of the static-magnetic-field magnet 21. At the inside of the gradient-magnetic-field coil unit 23, a bed 37 is provided to give an imaging region so that an examination subject P can be laid on the bed 37. The RF coil 24, in a certain case, is not incorporated within the gantry but provided nearby the bed 37 or the examination subject P.

The gradient-magnetic-field coil unit 23 is connected to the gradient-magnetic-field power supply 27. The X-axis gradient-magnetic-field coil 23x, the Y-axis gradient-magnetic-field coil 23y and the Z-axis gradient-magnetic-field coil 23z of the gradient-magnetic-field coil unit 23 are respectively connected to the X-axis gradient-magnetic-field power supply 27x, the Y-axis gradient-magnetic-field power supply 27y and the Z-axis gradient-magnetic-field power supply 27z of the gradient-magnetic-field power supply 27.

By the currents supplied respectively from the X-axis gradient-magnetic-field power supply 27x, the Y-axis gradient-magnetic-field power supply 27y and the Z-axis gradient-magnetic-field power supply 27z to the X-axis gradient-magnetic-field coil 23x, the Y-axis gradient-magnetic-field coil 23y and the Z-axis gradient-magnetic-field coil 23z, it is possible to structurally form, at the imaging region, an X-directional gradient magnetic field Gx, a Y-directional gradient magnetic field Gy and a Z-directional gradient magnetic field Gz.

The RF coil 24 is connected to the transmitter 29 and the receiver 30. The RF coil 24 has a function to receive an RF signal from the transmitter 29 and transmit it to the examination subject P and a function to receive an NMR signal caused by an excitation due to a nuclear-spin-based RF signal of within the examination subject P and provide it to the receiver 30.

Figure 2:
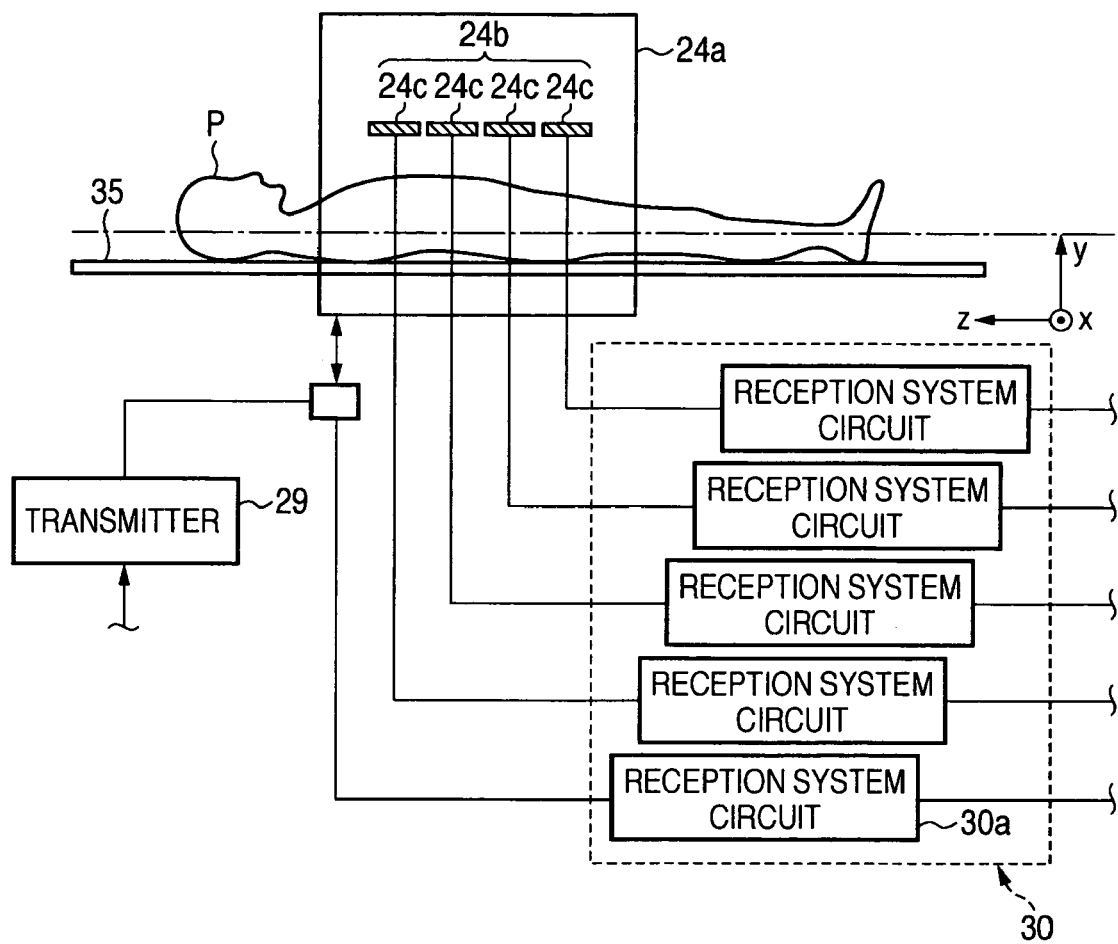
FIG. 2 is a diagram illustrating one example of an RF coil detailed configuration shown in FIG. 1.
Figure 3:
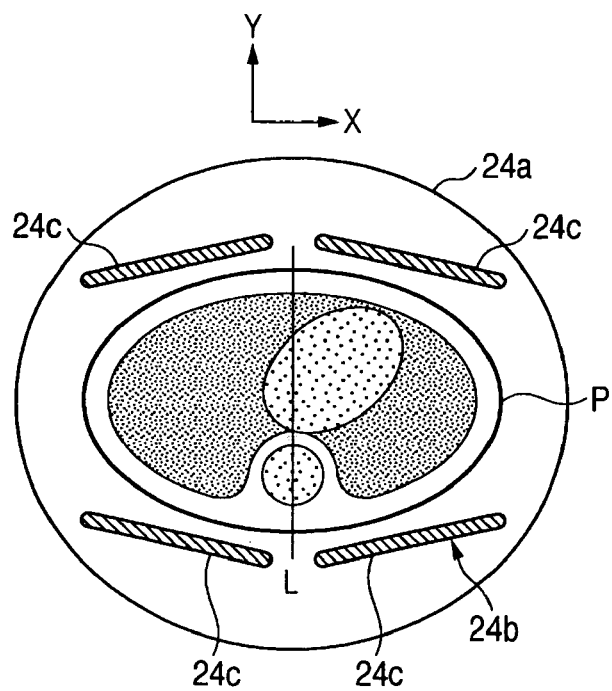
FIG. 3 is a sectional typical view illustrating an arrangement example of a WB coil and phased-array coil shown in FIG. 2.

FIG. 2 is a figure illustrating a detailed structural example of an RF coil 24 shown in FIG. 1. FIG. 3 is a sectional typical view illustrating an arrangement example of a WB coil 24a and phased-array coil 24b shown in FIG. 2.

The RF coil 24 is structured by a transmission RF coil 24 and a reception RF coil 24, for example. The transmission RF coil 24 uses a whole-body (WB) coil 24a while the reception RF coil 24 uses a phased-array coil 24b. The phased-array coil 24b has a plurality of surface coils 24c.

The surface coils 24c are separately connected to the respective reception-system circuits 30a.

Meanwhile, the surface coils 24c of the phased-array coil 24b are arranged, symmetric about the Z-axis, in peripheral regions of a section L including a particular position concerned of the examination subject P. Furthermore, the WB coil 24a is provided at the outer of the phased-array coil 24b. Thus, an RF signal can be transmitted to the examination subject P by the WB coil 24a while an NMR signal of from the section L including a particular position concerned can be received at multi-channels by the WB coil 24a or the surface coils 24c of the phased-array coil 24b and provided to the reception-system circuits 30a of each receiver 30.

However, the RF coil 24 may be structured by desired coils suited for various applications or by a single coil.

The sequence controller 31 of the control system 25 is connected to the gradient-magnetic-field power supply 27, the transmitter 29 and the receiver 30. The sequence controller 31 to stores the sequence information (describing the control information) required to drive the gradient-magnetic-field power supply 27, transmitter 29 and receiver 30, e.g. operation-control information as to the intensity, application time, application timing, etc. of a pulse current to be applied to the gradient-magnetic-field power supply 27. Controller 31 also drives the gradient-magnetic-field power supply 27, transmitter 29 and receiver 30 according to a predetermined stored sequence thereby generating an X-axis gradient-magnetic field Gx, Y-axis gradient-magnetic field Gy, Z-axis gradient-magnetic field Gz and RF signal.

Meanwhile, the sequence controller 31 is configured to receive raw data, as complex data obtained by detecting and A/D-converting an NMR signal in the receiver 30, and provide it to the computer 32.

For this reason, the transmitter 29 is provided with a function to supply an RF signal to the RF coil 24 depending upon the control information received from the sequence controller 31. Meanwhile, the receiver 30 is provided with a function to detect an NMR signal received from the RF coil 24 and perform a predetermined signal processing and generate raw data as a digitized complex data by A/D conversion, and a function to provide the generated raw data to the sequence controller 31.

By executing in the operation device 35 the program stored in the storage device 36 of the computer 32, various functions are provided to the computer 32 thus constituting a magnetic resonance data processing system 43 therein. However, the computer 32 may be constituted by the provision of a particular circuit without relying upon the program.

Figure 4:
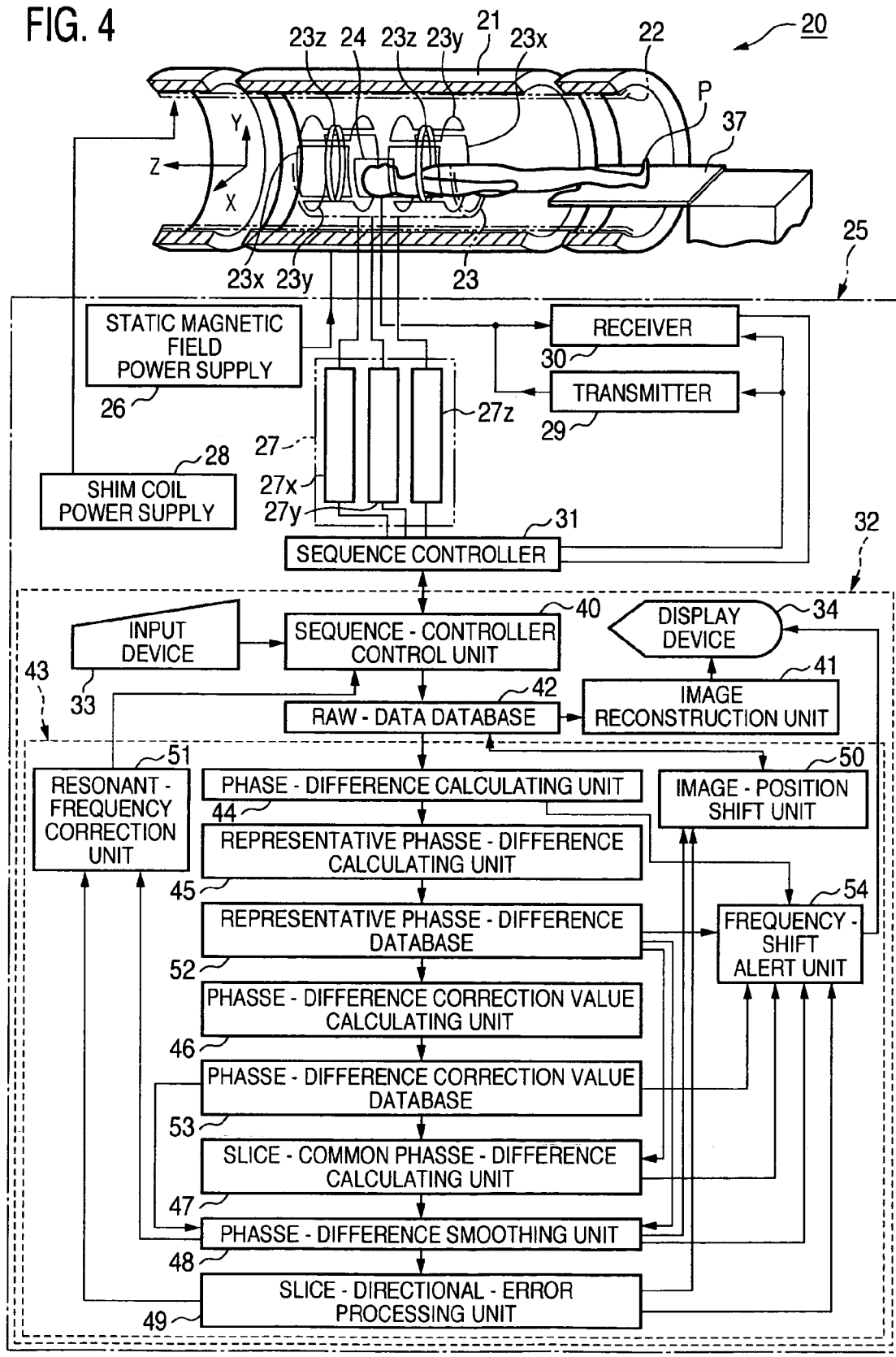
FIG. 4 is a functional block diagram of the magnetic resonance imaging apparatus shown in FIG. 1.

FIG. 4 is a functional block diagram of the magnetic resonance imaging apparatus 20 shown in FIG. 1.

The computer 32 serves as a sequence-controller control unit 40, an image reconstructing unit 41 and a raw-data database 42, based on the program.

The sequence-controller control unit 40 has a function to provide required sequence information to the sequence controller 31 depending upon the information of from the input device 33 or other constituent elements, thereby effecting a drive control. Particularly, the sequence-controller control unit 40 is allowed to provide a sequence, such as an EPI sequence, to the sequence controller 31, thereby effecting a dynamic scanning.

Meanwhile, the sequence-controller receives raw data from the sequence controller 31 and arranges it in a k-space (Fourier space) in the raw-data database 42. Consequently, raw data generated at the receiver 30 are saved in the raw-data database 42 wherein the raw data is arranged in k-space formed in the raw-data database 42.

The image reconstruction unit 41 has a function to fetch raw data from the raw-data database 42 and make a predetermined signal processing thereon, thereby reconstructing a tomographic image and displaying it on the display device 34. Namely, the image reconstruction unit 41 is configured to make various processing, including a two-dimensional or three-dimensional Fourier transform processing, on the raw data arranged in the k-space of the raw-data database 42, and provide it to the display device 34 thereby reconstructing a real space image from the raw data.

By reading a magnetic resonance imaging data processing program into the operation device 35 of the computer 32 and executing it therein, a magnetic resonance imaging data processing system 43 is constituted. The magnetic resonance imaging data processing system 43 has a phase-difference calculating unit 44, a representative phase-difference calculating unit 45, a phase-difference correction value calculating unit 46, a slice-common phase-difference calculating unit 47, a phase-difference smoothing unit 48, a slice-directional-error processing unit 49, an image-position shift unit 50, a resonant-frequency correction unit 51, a representative phase-difference database 52, a phase-difference correction value database 53 and a frequency shift alert unit 54. The magnetic resonance imaging data processing system 43 is a system for implementing fat suppression improvement by correcting the shift of a tomographic image resulting from a B0 shift during a dynamic scanning and correcting an RF-signal resonant frequency.

In case a B0 shift occurs, when taking an image according to a sequence not to cancel the phase of nuclear spin phase by means of a refocus pulse as in an FE sequence, the static magnetic-field intensity and resonant frequency, if shifted, causes a rotation in the phase of nuclear spin of within the examination subject P. Namely, the phase of nuclear spin of within the examination subject P changes in time under the influence of a B0 shift. Consequently, with the FE-system sequence, when there is an increase of resonant frequency in time due to a B0 shift, it is detected as a complex phase shift of raw data.

Furthermore, image reconstruction is done by obtaining real space data f(t) through a Fourier transform (exactly, inverse Fourier transform) of raw data $F(i\omega)$), as shown in equation (1-1). However, where there is a complex phase shift in the raw data, the complex phase difference exp $(-i\omega t_0)$ of the raw data is converted by Fourier transform into a positional shift $t_0$ of real-space data, as shown in equation (1-2).

$$F(i\omega) \rightarrow f(t) \qquad (1\text{-}1)$$

$$f(t-t0) \rightarrow \exp(-i\omega t_0) \cdot F(i\omega) \qquad (1\text{-}2)$$

For this reason, the magnetic resonance imaging data processing system 43 is configured to implement fat suppression improvement by correcting the shift of a tomographic image and the RF-signal resonant frequency depending upon the amount of shift in time of a raw-data complex phase due to a B0 shift.

The phase-difference calculating unit 44 of the magnetic resonance imaging data processing system 43 has a function to perform a 1DFT by extracting inline data, as data not phase-encoded, out of the raw-data database 42 thereby determining inline FT data, and a function to determine a phase difference as an amount of phase change in time of the determined inline FT data due to a B0 shift.

Here, explanation is made on a concrete example of inline data in relation to an EPI sequence. In the magnetic resonance imaging apparatus 20, dynamic scanning can be carried out according to a sequence, such as an EPI sequence.

Figure 5:
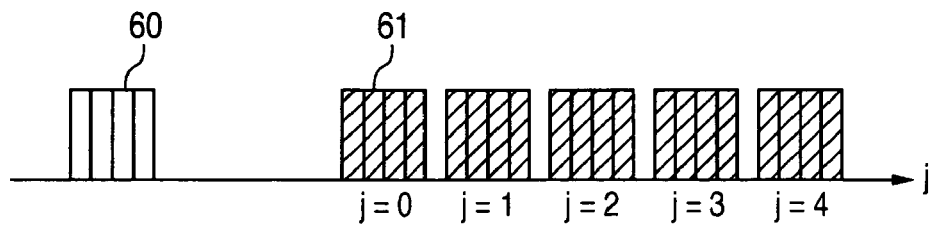
FIG. 5 is a dynamic image-taking time chart when taking an image on four slices according to an EPI sequence under a template scheme by means of the magnetic resonance imaging apparatus shown in FIG. 1.
Figure 6:
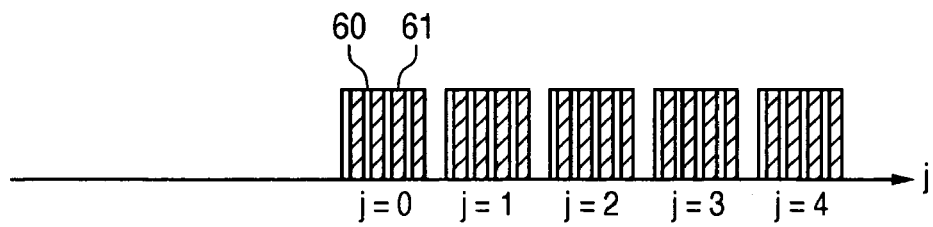
FIG. 6 is a dynamic image-taking time chart when taking an image on four slices according to an EPI sequence under an inline scheme by means of the magnetic resonance imaging apparatus shown in FIG. 1.

FIG. 5 illustrates a dynamic image-taking time chart for taking an image on four slices according to an EPI sequence in a template scheme by means of the magnetic resonance imaging apparatus 20 shown in FIG. 1. FIG. 6 illustrates a dynamic image-taking time chart for taking an image on four slices according to an EPI sequence in an inline scheme by means of the magnetic resonance imaging apparatus 20 shown in FIG. 1.

Meanwhile, FIGS. 5 and 6 shows, on the axis, a dynamic temporal aspect j, as a measurement unit of imaging based on dynamic scanning. Namely, in dynamic scanning, scanning is carried out continuously or intermittently at an interval of dynamic temporal aspect j by taking dynamic temporal aspect j as an image-taking unit.

The EPI sequence is generally constituted by a phase-correction sequence 60 for collecting raw data for phase correction and an imaging sequence 61 for collecting raw data for imaging. The phase-correction raw data, collected according to the phase-correction sequence 60, serves to reduce the false image, i.e. artifact, resulting from the causes of body movement and blood flow of the examination subject P, chemical shift, and so on.

In the EPI sequence, the phase correction schemes to be implemented for relieving artifact include a template scheme and an inline scheme.

In the template scheme, raw data collection according to a phase-correction sequence 60 is carried out prior to row data collection according to an imaging sequence 61. Namely, phase-correction raw data is collected once as pre-scanning. In collecting imaging raw data at each dynamic temporal aspect j by the execution of a dynamic scanning, utilized is the phase-correction raw data collected by pre-scanning. Consequently, when there is a state change in the magnetic resonance imaging apparatus 20 during the execution of a dynamic scanning, correction error increases to increase artifact.

In the inline scheme, raw data collection according to a phase-correction sequence 60 is carried out at each dynamic temporal aspect j, together with row data collection according to an imaging sequence 61, thus collecting phase-correction raw data required in image correction on the image-by-image basis. In the inline scheme, phase-correction raw data and imaging raw data are collected upon one excitation. As the number of data to be collected per excitation decreases, there is an increased effect of phase-correction raw data collection upon image quality, resulting in an increase of image blur. However, even when there is a status change in the magnetic resonance imaging apparatus 20 during the execution of a dynamic scanning, correction error is smaller and artifact is less as compared to the template scheme.

Figure 7:
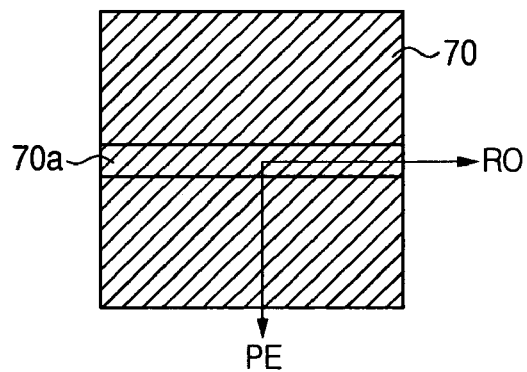
FIG. 7 is a concept view illustrating an image of the raw data collected according to the EPI sequence under the template scheme shown in FIG. 5 and arranged in a k-space.
Figure 8:
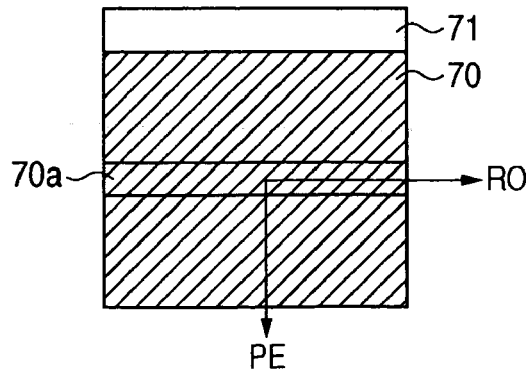
FIG. 8 is a concept view illustrating an image of the raw data collected according to the EPI sequence under the inline scheme shown in FIG. 6 and arranged in a k-space.

FIG. 7 is a figure illustrating a concept of the raw data collected and arranged in the k-space according to a template-schemed EPI sequence shown in FIG. 5. FIG. 8 is a figure illustrating a concept of the raw data collected and arranged in the k-space according to an inline-schemed EPI sequence shown in FIG. 6.

The raw data collected in the template scheme is all structured by imaging raw data 70 whereas the raw data collected in the inline scheme is structured by imaging raw data 70 and phase-correction raw data 71.

It is noted here that phase encode is not applied to the imaging raw data 70a including a k-space center and phase-correction raw data 71. Accordingly, where collecting raw data according to a template-schemed EPI sequence, the imaging raw data 70a including a k-space center can be given as inline data. Where collecting raw data according to an inline-schemed EPI sequence, one or both of the imaging raw data 70a including a k-space center and phase-correction raw data 71 can be given as inline data.

The representative phase-difference calculating unit 45 to receives successive phase differences of inline FT data from the phase-difference calculating unit 44. It calculates a representative phase difference conversion amount based on a phase difference of inline FT data due to a weighted-addition thereof from a reference time according to signal intensity of the RO-direction pixels.

The phase-difference correction value calculating unit 46 calculates a phase-difference correction value by correcting for the error of the phase-difference conversion amounts due to variations in channel-based sensitivities on surface coils 24c of the phased-array coil 24b.

The slice-common phase-difference calculating unit 47 has a function to calculate a shift amount of resonant frequency on each slice and decide whether or not the setting is to correct the frequency of the RF signal to be transmitted from the RF coil 24 to the examination subject P, and a function to determine a slice-common phase difference as an example of a phase-difference conversion amount by weight-adding together the phase-difference conversion amounts, such as representative phase differences or phase-difference correction values, of each slice when calculating a resonant-frequency shift amount common between slices.

The phase-difference smoothing unit 48 has a function to perform an error process by excluding from calculation a phase-difference conversion amount, such as a representative phase difference, phase-difference correction value or slice-common phase-difference, fallen outside a preset threshold, and a function to perform a smoothing process on a phase-difference conversion amount, such as a representative phase difference, phase-difference correction value or slice-common phase-difference, by using a running mean. Namely, the phase-difference smoothing unit 48 has a function to determine a smoothed phase difference as an example of a phase-difference conversion amount by executing an error process or smoothing process on the phase-difference conversion amount, such as a representative phase difference, phase-difference correction value or slice-common phase-difference.

The slice-directional-error processing unit 49 has a function to perform an error process by detecting an abnormal value of phase-difference conversion amount and make a phase-difference conversion amount on a slice abnormal in value into a phase-difference conversion amount on a slice not abnormal in value.

The image-position shift unit 50 has a function to shift the phase of raw data depending upon a phase-difference conversion amount such as a smoothed phase difference. This makes it possible to correct the position of an image depending upon a phase-difference conversion amount. Note that image positional correction includes not only positional correction of the image entirety but also distortional correction of the image entirety due to corrections of pixel-based positions.

The resonant-frequency correction unit 51 has a function to determine a correction amount of the frequency of an RF signal to be transmitted from the RF coil 24 to the examination subject P depending upon a phase-difference conversion amount such as a smoothed phase difference, and a function to provide a determined frequency correction amount of RF signal to the sequence-controller control unit 40 thereby correcting the sequence information and shifting the frequency of the RF signal.

The frequency-shift alert unit 54 has a function to compare the phase-difference conversion amount obtained depending upon the phase difference of inline FT data obtained by the phase-difference calculating unit 44 with a preset threshold, and a function to provide alert information to a display device 34 and other output devices, not shown, when the phase-difference conversion amount exceeds the threshold.

The operation of the magnetic resonance imaging apparatus 20 is now described.

Figure 9:
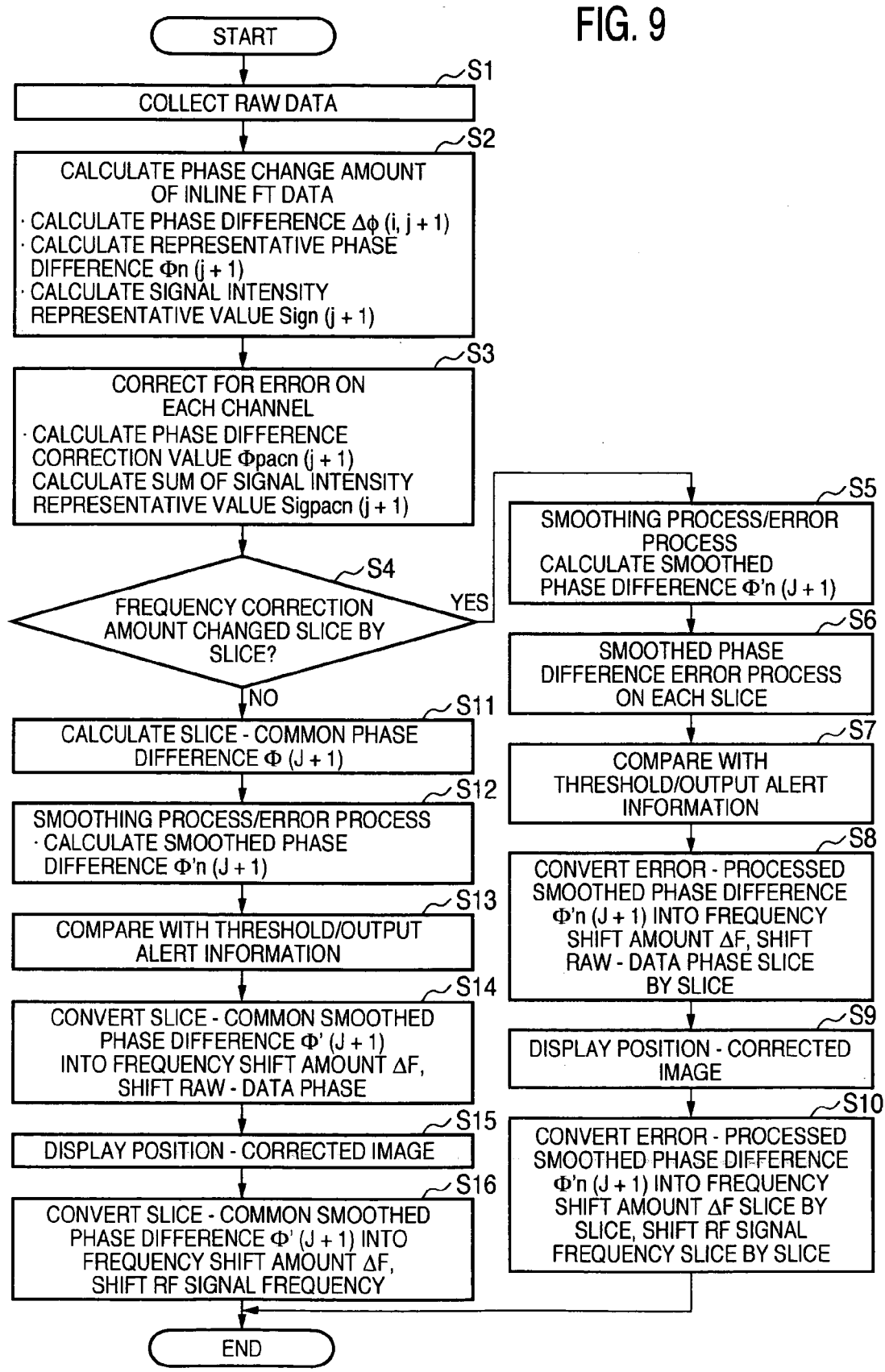
FIG. 9 is a flowchart illustrating a procedure for taking a tomographic image of an examination subject by means of the magnetic resonance imaging apparatus shown in FIG. 1.

FIG. 9 is a flowchart illustrating a procedure of taking a laminagraphic image of the examination subject P by means of the magnetic resonance imaging apparatus 20 shown in FIG. 1. The references attached with numerals following S in the figure designate the steps in the flowchart.

At first, at step S1, an operating instruction is given from the input device 33 to the sequence-controller control unit 40, to transmit an RF signal to the examination subject P. Simultaneously, the raw data of from the examination subject P is collected dynamically. For example, raw data is sequentially collected at a rate of approximately 30 temporal aspects per minutes by the magnetic resonance imaging apparatus 20. Consequently, when collecting 17 slices of raw data per temporal aspect, 510 slices per minute results, i.e. 510 slices of raw data are to be collected per minute.

The examination subject P is laid on the bed 37. A static magnetic field is formed at the imaging region of the static-magnetic-field magnet 21 (superconductive magnet) previously excited by the static-magnetic-field power supply 26. Meanwhile, a current is supplied from the shim-coil power supply 28 to the shim coil 22, to make uniform the static magnetic field formed at the imaging region.

Then, an operating instruction is given, together with sequence select information, from the input device 33 to the sequence-controller control unit 40. Consequently, the sequence-controller control unit 40 provides a sequence selected by the input device 33, e.g. FE_EPI sequence, to the sequence controller 31. The sequence controller 31 drives the gradient-magnetic-field power supply 27, transmitter 29 and receiver 30 according to the sequence, e.g. FE_EPI sequence, received from the sequence-controller control unit 40, thereby forming an X-axis gradient-magnetic field Gx, Y-axis gradient-magnetic field Gy and Z-axis gradient-magnetic field Gz and generating an RF signal.

On this occasion, the X-axis gradient-magnetic field Gx, the Y-axis gradient-magnetic field Gy and the Z-axis gradient-magnetic field Gz, that are formed by the gradient-magnetic-field coil, are mainly used as a phase encoding (PE) gradient magnetic field, a readout (RO) gradient magnetic field and a slice (SL) gradient magnetic field, respectively. Due to this, regularity appears in the rotational direction of nuclear spin of within the examine subject P. The X and Y coordinates, as secondary positional information on a slice, formed in the direction of Z-axis by the SL gradient magnetic field, are respectively converted into a phase change amount and a frequency change amount of the nuclear spin of within the examination subject P by the PE gradient magnetic field and the RO gradient magnetic field.

In the case of imaging according to an EPI sequence, a great power is given from the gradient-magnetic-field power supply 27 to the gradient-magnetic-field coil unit 23, thereby forming an intense RO gradient magnetic field.

Then, RF signals are sequentially given from the transmitter 29 to the RF coil 24 according to the sequence, to transmit RF signals from the RF coil 24 to the examination subject P. Where a WB coil 24a is provided, RF signals are transmitted from the WB coil 24a to the examination subject P.

Furthermore, the NMR signals, caused according to RF signal frequency by nuclear magnetic resonance of the nuclei contained in the slice of within the examination subject P, are received at the RF coil 24 and supplied sequentially to the receiver 30.

The receiver 30 receives the NMR signals from the RF coil 24 and performs various signal processes, such as pre-amplification, intermediate frequency conversion, phase detection, low-frequency amplification and filtering. Furthermore, the receiver 30 A/D-converts the NMR signals to thereby generate raw data as digital-data NMR signals. The receiver 30 provides the generated raw data to the sequence controller 31.

The sequence controller 31 provides the raw data received from the receiver 30 to the sequence-controller control unit 40. The sequence-controller control unit 40 arranges the raw data in the k-space formed in the raw-data database 42. As a result, the raw data changing in time is collected dynamically, thereby storing the raw data at each temporal aspect on each slice of the examination subject P to the raw-data database 42.

In the meanwhile, in case there is an increasing time of taking an image requiring a great power for the gradient magnetic field as in the $FE_{13}$ EPI sequence, heat is caused on the gradient-magnetic-field coil unit 23 to raise the temperature gradually. This increases the temperature of a ferrous shim inserted in the gradient-magnetic-field coil of the gradient-magnetic-field coil unit 23, thus causing so-called a BO shift that is to increase the static magnetic field intensity as a magnetic flux density in the imaging region.

Furthermore, where the magnetic resonance imaging apparatus 20 has a silencing mechanism using a vacuum technique, when the silencing mechanism is changed in its in vacuum degree, a BO shift occurs similarly to the case of a temperature rise of the ferrous shim.

Incidentally, the silencing mechanism using a vacuum technique is detailed in JP-A-2002-200055.

In the event of a BO shift occurrence, the resonant frequency of the NMR signal changes in time together with the static magnetic field intensity, i.e. changes dynamically. For this reason, in case a laminagraphic image is reconstructed based on the raw data in the state of a resonant frequency shifted, there is a fear to cause a positional shift in the laminagraphic image. Accordingly, the magnetic resonance imaging data processing system 43 is allowed to calculate a dynamic variation amount of resonant frequency and correct the laminagraphic image for its positional shift.

In the case of collecting raw data according to a sequence not to cancel the phase of nuclear spin like an $FE_{13}$ EPI sequence, the resonant frequency, if dynamically varied due to a BO shift, causes a rotation in the phase of nuclear spin of within the examination subject P. Namely, the phase of nuclear spin of within the examination subject P changes in time under the influence of the BO shift. For this reason, a shift amount of resonant frequency can be calculated from a dynamic variation amount in the phase of raw data due to the BO shift.

Accordingly, at step S2, the phase-difference calculating unit 44 first calculates, as to the RO-directional pixels of each slice, a phase difference as a change amount in time of phase due to a BO shift of inline data as a raw data not phase-encoded, in order to calculate a shift amount of resonant frequency. Furthermore, the representative phase-difference calculating unit 45 calculates a representative phase difference not relying upon the RO-directional pixels from the phase difference of inline data on each pixel in the RO direction.

Figure 10:
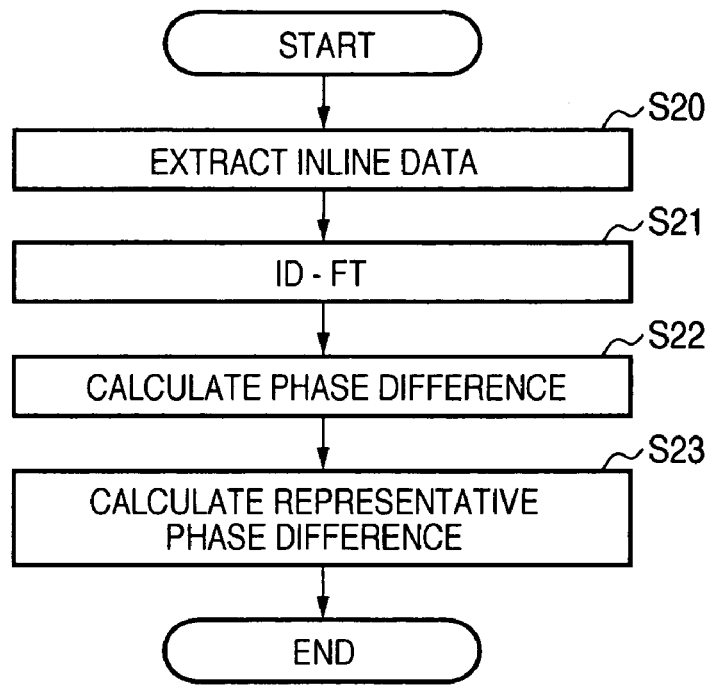
FIG. 10 is a flowchart illustrating a procedure for calculating a phase change amount in time of raw data by means of a phase difference calculation unit and representative phase difference calculation unit of the magnetic resonance data processing system shown in FIG. 4.

FIG. 10 is a flowchart illustrating a procedure of calculating a change amount of phase in time of the raw data by means of the phase-difference calculating unit 44 and representative phase-difference calculating unit 45 of the magnetic resonance imaging data processing system 43 shown in FIG. 4. The references attached with numerals following S in the figure designate the steps in the flowchart.

At first, at step S20, the phase-difference calculating unit 44 extracts inline data as raw data not phase-encoded at each dynamic temporal aspect on the slice from the raw-data database 42. Namely, the phase-difference calculating unit 44 extracts inline data as raw data not changed in phase due to phase encode, in order to calculate a phase change resulting only from the encoding under the influence of a BO shift.

Then, at step S21, the phase-difference calculating unit 44 executes a one-dimensional Fourier transform (1D-FT) on the extracted inline data on the slice, thereby obtaining inline FT data.

Then, at step S22, the phase-difference calculating unit 44 calculates a change amount in time of inline FT data on the slice. Namely, for each slice, the phase-difference calculating unit 44 determines a phase difference between a phase of inline FT data at a dynamic temporal aspect on the RO-directional pixels and a phase of inline FT data at the next dynamic temporal aspect, according to the known Ahn method of equation (4).

Figure 11:
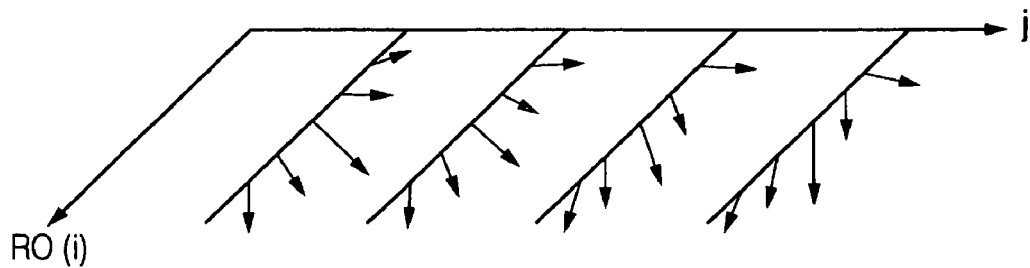
FIG. 11 is a concept view illustrating an example of arranging, in a dynamic temporal aspect, the inline FT data collected by the magnetic resonance imaging apparatus shown in FIG. 1, on a single slice.

FIG. 11 is a concept view illustrating an example of an arrangement, in a direction of dynamic temporal aspect, of the inline FT data collected on a single slice by the magnetic resonant imaging apparatus 20 shown in FIG. 1.

Provided that a dynamic temporal aspect is taken j and an ID of the pixels in the RO direction is taken i as shown in FIG. 11, the conjugate complex numbers of the inline FT data at dynamic temporal aspect j and j+1 on the pixel i in the RO direction and the inline FT data at dynamic temporal aspect j are expressed by equation (2-1), equation (2-2) and equation (2-3).

$$S(j) = |Sj|\exp(\theta j) = |Sj|\{\cos(\theta j) + i\sin(\theta j)\}. \quad (2\text{-}1)$$

$$S(j+1) = \\ |Sj+1|\exp(\theta j+1) = |Sj+1|\{\cos(\theta j+1) + i\sin(\theta j+1)\} \quad (2\text{-}2)$$

$$S*(j) = |Sj|\{\cos(\theta j) - i\sin(\theta j)\} = |Sj|\exp(-\theta j) \quad (2\text{-}3)$$

Herein, j: ID (j=0, 1, . . . ) at dynamic temporal aspect

θj: phase of inline FT data at dynamic temporal aspect j

S(j): inline FT data at dynamic temporal aspect j

S*(j): conjugate complex number to inline FT data at dynamic temporal aspect j

Sj: signal intensity absolute value of inline FT data at dynamic temporal aspect j.

Accordingly, in equation (3) is expressed a product of a conjugate complex number S*(j) to the inline FT data at dynamic temporal aspect j and inline FT data S(j+1) at dynamic temporal aspect j+1.

$$S*(j) \cdot S(j+1) = |Sj||Sj+1|\exp\{(\theta j+1) - (\theta j)\} \quad (3)$$

Here, the phase angle in equation (3) means a complex phase difference in inline FT data between dynamic temporal aspect j+1 and dynamic temporal aspect j. As a result, the complex phase difference between the inline FT data at dynamic temporal aspect J+1 considered on a pixel i in the RO direction and the inline FT data in the one-preceding dynamic temporal aspect J, is given by equation (4).

$$\Delta\phi(i, J+1) = \arg\{S*(i, J) \cdot S(i, J+1)\} \quad (4)$$

Herein, i: ID (i=0, 1, . . . , I) of the pixels in the RO direction j: ID (j=0, 1, . . . , J−1, J, J+1, . . . ) at dynamic temporal aspect S(i, J+1): inline FT data at dynamic temporal aspect J+1 on the pixel i in the RO direction S*(i, J): conjugate complex number to inline FT data S (i, J)

Δφ(i, J+1): complex phase-difference between inline FT data at dynamic temporal aspect J on the pixel i in the RO direction and inline FT data at dynamic temporal aspect J+1.

Meanwhile, the complex phase difference Δφ(i, J+1) of inline FT data has an initial value of Δφ(i, 0)=0 while arg represents an operator for operating a complex phase. Furthermore, the complex phase difference Δφ(i, J+1) of inline FT data is assumed −180 degrees or greater and +180 degrees or smaller.

The phase-difference calculating unit 44 determines a composite phase difference Δφ(i, J+1) of between the inline FT data at dynamic temporal aspect J on the pixel i in the RO direction and the inline FT data at dynamic temporal aspect J+1, and provides it to the representative phase-difference calculating unit 45.

Then, at step S23, the representative phase-difference calculating unit 45 determines, from equation (5), a representative phase difference Φn(J+1) of between the inline FT data in a reference temporal aspect as a reference dynamic time phase on each slice and the inline FT data at dynamic temporal aspect J+1. Namely, the representative phase-difference calculating unit 45 calculates a representative phase difference Φn(J+1) by summing up complex phase differences Δφ(i, J+1) on the pixels (0–I) in the RO direction of the slice n with using the weighting of signal intensity absolute values of inline FT data S (i, J+1) and by adding together the sum value of the weighted inline Ft data in order at from reference temporal aspect j to dynamic temporal aspect J+1 considered.

$$\Phi n(J+1) = \frac{1}{\text{Sign}(J+1)} \left\{ \sum_{i=0}^{I} (|S(i, J+1)| \cdot \Delta\phi(i, J+1)) \right\} + \Phi n(J)$$

$$\text{Sign}(J+1) = \sum_{i=0}^{I} |S(i, J+1)|$$

Herein,

Φn(J+1): representative phase difference of inline FT data in between reference temporal aspect and dynamic temporal aspect J+1, on slice n Sign(J+1): sum of inline-FT-data-signal intensity absolute values (signal intensity representative value) on the pixels in the RO direction, in dynamic time phase J+1 on slice n.

Incidentally, the reference temporal aspect is desirably a dynamic temporal aspect, e.g. of three or more of temporal aspect, from the consideration of the effect of T1 relaxing or eddy current upon inline FT data.

The representative phase-difference calculating unit 45 writes the representative phase difference Φn(J+1) of inline FT data on each slice n, together with the signal intensity representative value Sign(J+1), to the representative phase-difference database 52. Here, in the case of using a phased-array coil 24b as an RF coil 24, raw data is independently obtained from the surface coils 24c of the phased array coil 24b. For each surface coil 24c, the inline FT data at dynamic temporal aspect J+1 on each slice n is calculated by the representative phase-difference calculating unit 45, and written together with the signal intensity representative value Sign(J+1) of inline FT data at dynamic temporal aspect J+1 to the representative phase-difference database 52.

Meanwhile, due to the resonant frequency variations resulting from a BO shift, channel-based variations occur in the sensitivity of the phased-array coil 24b used as an RF coil 24.

For this reason, at step S3 in FIG. 9, the phase-difference correction value calculating unit 46 calculates a phase-difference correction value on a slice-by-slice basis, in order to correct for the error of raw data occurring due to the channel-based sensitivity variations on the surface coils 24c of the phased-array coil 24b.

Figure 12:
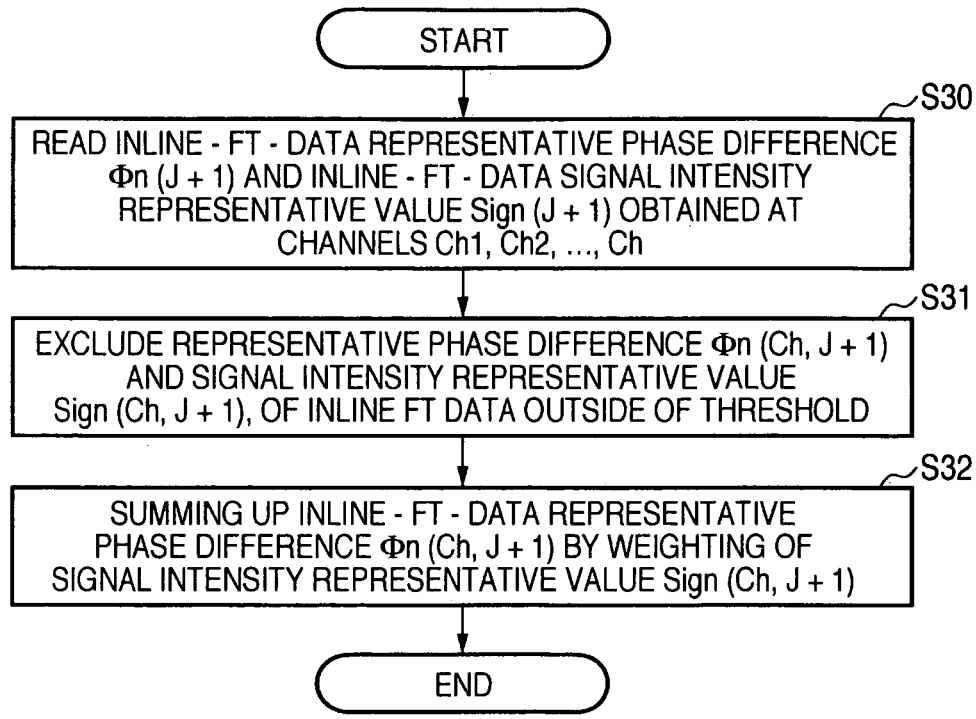
FIG. 12 is a flowchart illustrating a procedure for calculating a representative phase correction value of raw data by means of the phase difference calculation unit of the magnetic resonance data processing system shown in FIG. 4.

FIG. 12 is a flowchart showing a procedure of calculating a representative phase correction value of raw data by means of the phase-difference correction value calculating unit 46 of the magnetic resonant imaging data processing system 43 shown in FIG. 4. The references attached with numerals following S in the figure designate the steps in the flowchart.

At first, at step S30, the phase-difference correction value calculating unit 46 reads, from the representative phase-difference database 52, a representative phase difference Φn(ch, J+1) (1≦ch≦CH) of inline FT data and signal intensity representative value Sign(ch, J+1) of inline FT data at dynamic temporal aspect J+1 based on the raw data on each slice n obtained by way of channels Ch1, Ch2, . . . , Ch CH from the surface coils 24c in the number of CH constituting the phased-array coil 24b.

Then, at step S31, the phase-difference correction value calculating unit 46 makes as channels Ch1, Ch2, . . . , Ch of phased-array coil 24b, and extracts, on each slice n, a representative phase difference Φn(ch, J+1) and signal intensity representative value Sign (ch, J+1) of inline FT data on the channels the signal intensity representative value Sign (ch, J+1) lies within a preset threshold. The threshold, in this case, can be given in a constant range having, as a reference, a maximum value of the signal intensity representative values Sign(ch, J+1) of inline FT data, for example.

Namely, in order to exclude from calculation the raw data of from the channels not contributing to the reconstruction of a tomographic image due to noises, the phase-difference correction value calculation unit 46 removes the representative phase difference Φn(ch, J+1) and signal intensity representative value Sign(ch, J+1) of inline FT data lying outside the preset threshold.

Incidentally, where the influence of noise can be ignored, there is not always a need to perform an extraction process of representative phase difference Φn(ch, J+1) and signal intensity representative value Sign(ch, J+1) of inline FT data.

Then, at step S32, the phase-difference correction value calculating unit 46 sums up the extracted representative phase differences Φn(ch, J+1) of inline FT data with the weighting of the signal intensity representative values Sign (ch, J+1), thereby calculating, for each slice n, a phase-difference correction value Φpacn(J+1) corrected by considering the variations of sensitivity between the channels of the phase-array coil 24b.

$$\Phi pacn(J+1) = \frac{\sum_{ch=1}^{CH} \{Sign(ch, J+1) \cdot \Phi n(h, J+1)\}}{\sum_{ch=1}^{CH} Sign(ch, J+1)} \quad (6)$$

$$Sigpacn(J+1) = \sum_{ch=1}^{CH} Sign(ch, J+1)$$

Herein,

Φpacn(J+1) phase-difference correction value of inline FT data at dynamic temporal aspect J+1 on slice n Sign(ch, J+1): signal intensity representative value of inline FT data on slice n through channel ch at dynamic temporal aspect J+1

Sigpacn(J+1): sum of signal intensity representative values of inline FT data on slice n, through channel ch, at dynamic temporal aspect J+1

Φn(ch, J+1): representative phase difference of inline FT data, on slice n, through channel ch, at dynamic temporal aspect J+1.

Note that, in equation (6), calculation does not include the representative phase difference Φn(ch, J+1) and signal intensity representative value Sign(ch, J+1) of inline FT data through the channel ch excluded from calculation at step S31.

Furthermore, the phase-difference correction value calculating unit 46 writes the phase-difference correction value Φpacn(J+1) of inline FT data and the sum of signal intensity representative values Sigpacn(J+1) of from channel 1 to CH, to the phase-difference correction value database 53.

As a result, where the RF coil 24 is a phased-array coil 24b, the phase-difference correction value Φpacn(J+1) of inline FT data on slices n and the sum of signal intensity representative values Sigpacn(J+1) through channels are stored in the phase-difference correction value database 53. Meanwhile, where the RF coil 24 is not a phased-array coil 24b, the representative phase difference Φn(J+1) of inline FT data on slices n and the signal intensity representative value Sign(J+1) are stored in the representative phase-difference database 52.

Then, at step S4 in FIG. 9, the slice-common phase-difference calculating unit 47 calculates a shift amount of resonant frequency on each slice n and decides whether or not setting is to correct the frequency of an RF signal to be transmitted from the RF coil 24 to the examination subject P. When decided that setting is to calculate a shift amount of resonant frequency on each slice n, a process start instruction is given to the phase-difference smoothing unit 48.

Here, in case noise is superimposed on a particular one of inline FT data, the signal intensity representative value Sign(J+1) of inline FT data greatly changes in time and becomes an abnormal value. Meanwhile, it is known that, when the examination subject P moves, there is caused a variation in the estimation value of B0 shift amount. For this reason, there is a fear that the representative phase difference Φn(J+1) vary due to a movement of the examination subject P.

Accordingly, at step S5 in FIG. 9, the phase-difference smoothing unit 48 makes a smoothing process on the phase-difference correction value Φpacn(J+1) of inline FT data stored in the phase-difference correction value database 53 or the representative phase difference Φn(J+1) of inline FT data stored in the representative phase-difference database 52, on each slice n by use of a running mean, in order to reduce the influence under the variation in the representative phase difference Φn(J+1) of inline FT data due to a movement of the examination subject P. However, when the examination subject P moves a constant distance or greater per unit time, it is impossible to follow up the movement of the examination subject P even if performing a smoothing process on the representative phase difference Φn(J+1) or phase-difference correction value Φpacn(J+1) of inline FT data by use of a running mean.

For this reason, when the movement amount of the examination subject P is constant, the phase-difference smoothing unit 48 excludes the representative phase difference Φn(J+1) or phase-difference correction value Φpacn(J+1) of inline FT data at the corresponding dynamic temporal aspect J+1, from the calculation of a running mean.

Meanwhile, the phase-difference smoothing unit 48 detects an abnormality in the signal intensity representative value Sign(J+1) of inline FT data due to the influence of noise in addition to the smoothing process and performs an error process thereon thereby excluding it from calculation.

Incidentally, because the smoothing and error processes on the phase-difference correction value Φpacn(J+1) of inline FT data is similar in manner to the smoothing and error processes on the representative phase difference Φn(J+1) of inline FT data, description is made here on the smoothing and error processes on the representative phase difference Φn(J+1) of inline FT data.

Figure 13:
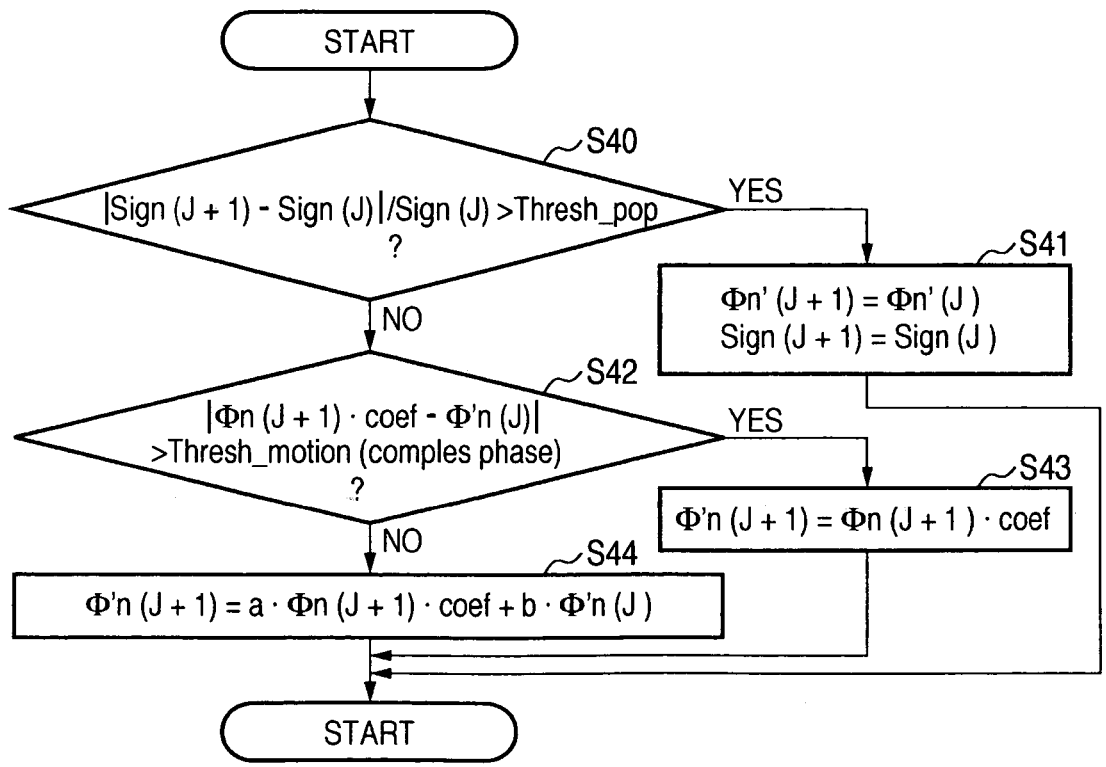
FIG. 13 is a flowchart illustrating a procedure configured to perform a smoothing process and error process on a representative phase difference of inline FT data by means of the phase difference smoothing unit of the magnetic resonance data processing system shown in FIG. 4.

FIG. 13 is a flowchart illustrating a procedure of executing smoothing and error processes on the representative phase difference of inline FT data by the phase-difference smoothing unit 48 of the magnetic resonance imaging data processing system 43 shown in FIG. 4. The references attached with numerals following S in the figure designate the steps in the flowchart.

At first, at step S40, the phase-difference smoothing unit 48 decides whether or not the variation amount in time of signal intensity representative value Sign(J+1) is conspicuously great and abnormal, i.e. whether or not it is greater than a preset threshold Thresh_pop as a reference. Namely, the phase-difference smoothing unit 48 decides whether or not the variation amount of between the signal intensity representative value Sign(J) at a dynamic temporal aspect J and the signal intensity representative value Sign(J+1) at the next dynamic temporal aspect J+1 is greater than the threshold Thresh_pop, according to equation (7).

$$|Sign(J+1)-Sign(J)|/Sign(J) > Thresh\_pop \quad (7)$$

Herein,

Thresh_pop: threshold as to the variation in time of signal intensity representative value of inline FT data.

Then, when equation (7) is satisfied, the phase-difference smoothing unit 48 at step S41 performs a smoothing or error processes on each slice n, as given in equations (8-1) and (8-2).

$$\Phi'n(J+1) = \Phi'n(J) \quad (8-1)$$

$$Sign(J+1) = Sign(J) \quad (8-2)$$

Herein, $\Phi'n(J)$: representative phase difference (smoothened phase difference), smoothing and error processed, of inline FT data at dynamic temporal aspect J on slice n.

Namely, when decided the variation amount in time of between the signal intensity representative values Sign(J) and Sign(J+1) at dynamic temporal aspect J and J+1 exceeds the threshold and hence is abnormal, the phase-difference smoothing unit 48 renders the one-preceding signal intensity representative value Sign(J) at dynamic temporal aspect J as a signal intensity representative value Sign(J+1) at dynamic temporal aspect J+1, as shown in equation (8-2).

Thus, the smoothed phase difference $\Phi'n(J+1)$ as a representative phase difference, smoothing and error processed, of inline FT data at dynamic temporal aspect J+1 is rendered as a smoothed phase difference $\Phi'n(J)$ at one-preceding temporal aspect J, as shown in equation (8-1).

Meanwhile, when equation (7) is not satisfied, the phase-difference smoothing unit 48 at step S42 decides whether or not there is no great change in time of the representative phase difference Φn(J+1) of inline FT data due to the cause of a movement of the examination subject P. Namely, the phase-difference smoothing unit 48 decides whether or not the variation amount in the corrected value of representative phase difference Φn(J+1) of inline FT data at dynamic temporal aspect J+1 from the representative phase difference $\Phi'n(J)$ of inline FT data at dynamic temporal aspect J is greater than a preset threshold Thresh_motion as a reference, according to equation (9).

$$|\Phi n(J+1) \cdot coef - \Phi'n(J)| > Thresh\_motion \quad (9)$$

Herein,

Thresh_motion: threshold of the variation in time of the representative phase difference of inline FT data.

coef: correction coefficient.

Incidentally, the correction coefficient coef can be suitably set in accordance with the necessity for correcting for the error in the representative phase difference Φn(J+1) when error occurs at a constant rate in the representative phase difference Φn(J+1) resulting from the errors contained in the data used in determining a representative phase difference Φn(J+1) of inline FT data at dynamic temporal aspect J+1. Accordingly, the correction coefficient coef may be taken a value 1 when there is no error at a constant rate in the representative phase difference Φn(J+1).

Then, in the case equation (9) is satisfied, the phase-difference smoothing unit 48 at step S43 carries out a smoothing process or an error process, as given in equation (10).

$$\Phi'n(J+1) = \Phi n(J+1) \cdot coef \quad (10)$$

Namely, the phase-difference smoothing unit 48, when decided that the variation in time of representative phase difference Φn(J+1) of inline FT data exceeds the threshold and hence is to be excluded from the calculation of a running mean, takes as a smoothed phase difference $\Phi n'(J+1)$ a value the correction coefficient is multiplied on the representative phase difference Φn(J+1) of inline FT data, as shown in equation (10).

The correction coefficient coef can be suitably set similarly to the correction coefficient coef of equation (9). The correction coefficient coef in equation (10) may be set equal to the correction coefficient coef in equation (9) or set at a different value therefrom separately.

Meanwhile, in the case equation (9) is not satisfied, the phase-difference smoothing unit 48 at step S44 calculates a smoothed phase difference Φ'n(J+1) by use of the running mean of from the smoothed phase difference Φ'n(J) at the one-preceding dynamic temporal aspect J.

$$\Phi'n(J+1) = a \cdot \Phi n(J+1) \cdot coef + b \cdot \Phi n(J) \quad (11)$$

Herein, a, b (>0): coefficient of running mean a+b=1.0.

Note that the correction coefficient coef can be suitably set similarly to the correction coefficient coef for equations (9) and (10). The correction coefficient coef in equation (11) maybe set equal to the correction coefficient coef in equation (9) or (10) or set at a different value therefrom separately.

The coefficient a, b of running mean can be set at a suitable value for adjusting the weights of the smoothed phase difference Φn(J) at dynamic temporal aspect J and smoothed phase difference Φn(J+1) at dynamic temporal aspect J+1, based on the known way of thinking concerning running mean. Namely, when to reflect the smoothed phase difference Φn'(J) greater than the representative phase difference Φn(J+1) upon the smoothed phase difference Φ'n(J+1), the value-b may be set greater than the value-a. When to reflect the smoothed phase difference Φn'(J) smaller than the representative phase difference Φn(J+1) upon the smoothed phase difference Φ'n(J+1), the value-b may be set smaller than the value-a.

In performing the smoothing and error processes on the phase-difference correction value Φpacn(J+1) of inline FT data, calculation is made in equations (7) to (11) by replacing the representative phase difference Φn(J+1) of inline FT data with a phase-difference correction value Φpacn(J+1) of inline Ft data and the signal intensity representative value Sign(J+1) of inline FT data with a sum Sigpacn(J+1) of signal intensity representative values through the channels, respectively.

In this manner, the representative phase-difference calculating unit 45, the phase-difference correction value calculating unit 46 and the phase-difference smoothing unit 48 calculate, on each slice n, a representative phase difference Φn(J+1), a signal intensity representative value Sign(J+1), a phase-difference correction value Φpacn(J+1), a sum Sigpacn(J+1) of signal intensity representative values through the channels, and a smoothed phase difference Φ'n(J+1), of inline FT data.

Here, there is a fear to calculate an abnormal value of smoothed phase difference Φ'n(J+1) as to a particular slice n, under the influence of noise, etc.

Figure 14:
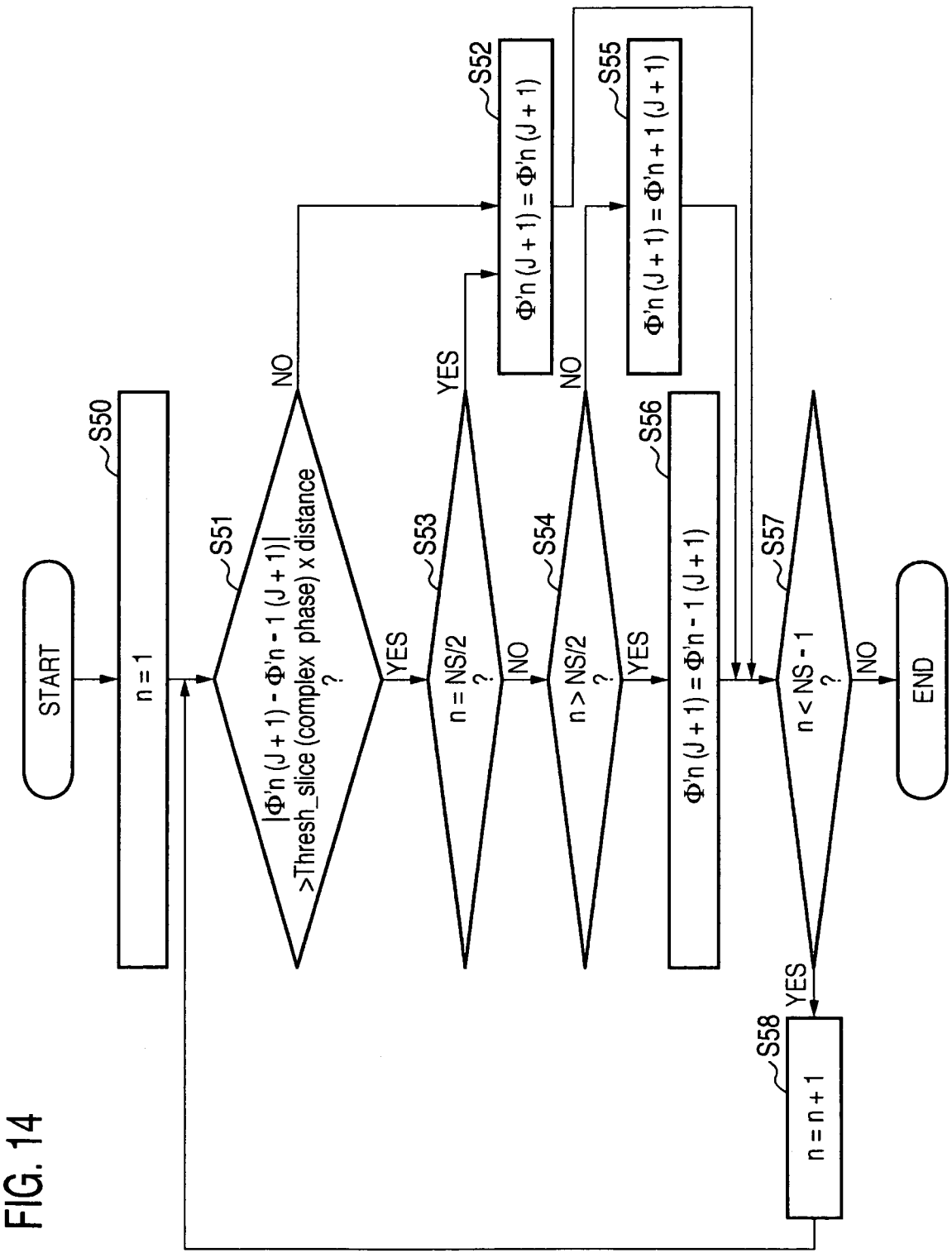
FIG. 14 is a flowchart illustrating a procedure configured to perform an error process on the smoothed phase difference of inline FT data on each slice n by means of a slice-directional-error processing unit of the magnetic resonance data processing system shown in FIG. 4.
Figure 15:
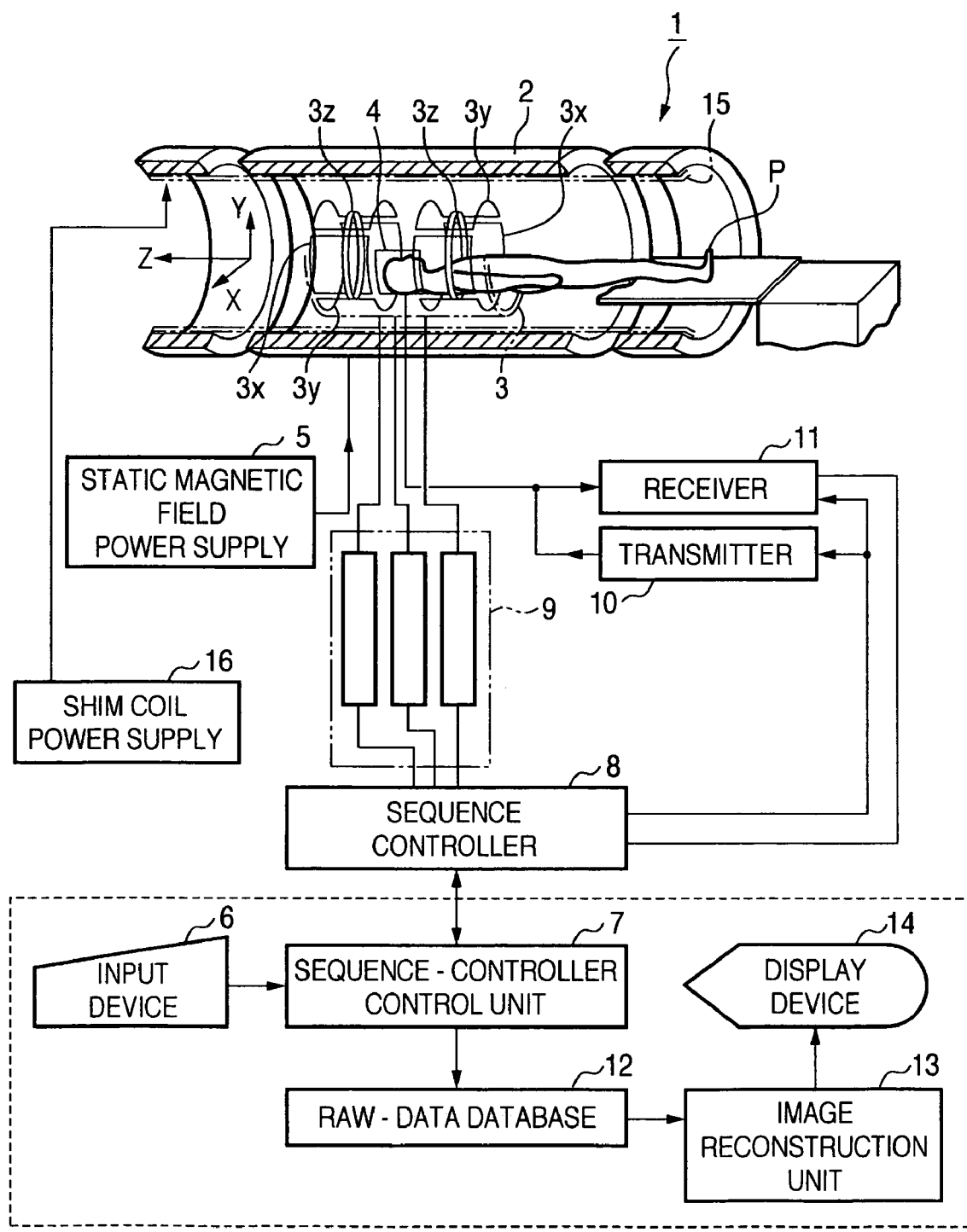
FIG. 15 is an arrangement diagram of an MRI apparatus in the prior art.

Accordingly, at step S6 in FIG. 9, the slice-directional-error processing unit 49 performs an error process by receiving from the phase-difference smoothing unit 48 a smoothed phase difference Φ'n(J+1) of inline FT data at every dynamic temporal aspect J+1 on each slice n, and correcting the abnormal value in the smoothed phase difference Φ'n(J+1) FIG. 14 is a flowchart illustrating a procedure of performing an error process on the smoothed phase difference Φ'n(J+1) of inline FT data on each slice n by the slice-directional-error processing unit 49 of the magnetic resonance imaging data processing system 43 shown in FIG. 4. The references attached with numerals following S in the figure designate the steps in the flowchart.

At first, at step S50, the slice-directional-error processing unit 49 substitutes 1 for n as an initial condition in order to select a particular slice n out of the slices-n (n=0, 1, . . . , NS-1) in the number of NS, i.e. slice number n of from 0 to NS-1. Here, it is assumed that slice number n increases or decreases with a coordinate value of slice position.

Then, at step S51, the slice-directional-error processing unit 49 compares the smoothed phase differences Φ'n(J+1) and Φ'n-1(J+1) of inline FT data that are on the adjacent slices n and n-1. Then, the slice-directional-error processing unit 49 decides whether or not there is a great difference between the smoothed phase differences Φ'n(J+1) and Φ'n-1(J+1) of inline FT data that are on the adjacent slices.

Namely, the slice-directional-error processing unit 49 decides whether or not the difference between the smoothed phase difference Φ'n(J+1) of inline FT data on slice n and the smoothed phase difference Φ'n-1 (J+1) of inline FT data on slice n-1 is greater than a preset threshold Thresh_slice, according to equation (12).

$$|\Phi'n(J+1) - \Phi'n-1(J+1)| > \text{Thresh\_slice} \times \text{distance} \quad (12)$$

Herein,

Thresh_slice: threshold of the difference between the smoothed phase differences on slices n and n-1.

distance: distance between slice n and slice n-1.

In the case equation (12) is not satisfied, the slice-directional-error processing unit 49 at step S52 decides that the smoothed phase difference Φ'n(J+1) of inline FT data on slice n is not at an abnormal value affected by noise or the like. As shown in equation (13), the smoothed phase difference Φ'n(J+1) is used as it is without performing a correction.

$$\Phi'n(J+1) = \Phi'n(J+1) \quad (13)$$

Meanwhile, when equation (12) is satisfied, decision is made at step S53 as to whether or not slice n is a slice n as a reference, e.g. a center slice NS/2 (or integer part of NS/2 when NS is an add number), according to equation (14).

$$n = NS/2 \quad (14)$$

When equation (14) is satisfied, the slice n considered is a reference slice. Accordingly, at step S52, the smoothed phase difference Φ'n(J+1) is not corrected as shown in equation (13), i.e. the smoothed phase difference Φ'n(J+1) is used as it is.

Meanwhile, when equation (14) is not satisfied, the slice-directional-error processing unit 49 at step S54 decides that the smoothed phase difference Φ'n(J+1) is abnormal in value and the slice n considered is not a reference slice. Consequently, the slice-directional-error processing unit 49 performs an error process by putting the smoothed phase difference Φ'n(J+1) of inline FT data on slice n as a smoothed phase difference Φ'n+1(J+1) or Φ'n-1(J+1) of inline FT data on the slice n+1 or n-1 adjacent the reference slice, e.g. the center slice NS/2 (or integer part of NS/2 when NS is an add number).

The slice-directional-error processing unit 49 decides whether or not the selected slice n is a slice on a side more positive than the center slice NS/2. Namely, the slice-directional-error processing unit 49 decides whether or not the selected slice has a slice number n greater than the slice number NS/2 of the center slice, according to equation (15).

$$n > NS/2 \quad (15)$$

When equation (15) is not satisfied, the slice-directional-error processing unit 49 at step S55 decides that the selected slice n lies not on the side more positive than the center slice NS/2, and performs an error process by putting the smoothed phase difference Φ'n(J+1) of inline FT data on slice n as a smoothed phase difference Φ'n+1(J+1) of inline FT data on slice n+1 adjacent positive relative to the slice n, according to equation (16).

$$\Phi'n(J+1)=\Phi'n+1(J+1) \quad (16)$$

Meanwhile, when equation (15) is not satisfied, the slice-directional-error processing unit 49 at step S56 decides that the selected slice n lies on the side more positive than the center slice NS/2, and performs an error process by putting the smoothed phase difference Φ'n(J+1) of inline FT data on slice n as a smoothed phase difference Φ'n−1(J+1) of inline FT data on slice n−1 adjacent negative relative to the slice n according to equation (17).

$$\Phi'n(J+1)=\Phi'n-1(J+1) \quad (17)$$

Then, at step S57, the slice-directional-error processing unit 49 decides whether or not the error process of smoothed phase difference Φ'n(J+1) has been completed on all the slices n in the number of NS (0≦n≦NS-1).

When the error process of smoothed phase difference Φ'n(J+1) has not been completed on all the slices n, the slice-directional-error processing unit 49 at step S58 substitutes n+1 for n thereby selecting the next slice n+1.

Consequently, the process of from step S51 to step S56 is repeatedly executed until the error process of smoothed phase difference Φ'n(J+1) has been completed on all the slices n (0≦n≦NS-1). When the error process of smoothed phase difference Φ'n(J+1) has been completed on all the slices n (0≦n≦NS-1), the slice-directional-error processing unit 49 completes the error process of smoothed phase difference Φ'n(J+1) of inline FT data.

Incidentally, the slice-directional-error processing unit 49 may execute the error process by a method of putting the smoothed phase difference Φ'n(J+1) of inline FT data on the slice n decided abnormal as a smoothed phase difference Φ'n+l(J+1) or Φ'n−1(J+1) of inline FT data on the slice adjacent a slice the signal intensity representative value Sign(J+1) of inline FT data is maximized instead of that closer to the center slice, or a method of comparing the signal intensity representative values Sign(J+1) and Sign-1 (J+1) and putting that one as the greater phase difference Φ'n+l(J+1) or Φ'n−1(J+1).

Then, the slice-directional-error processing unit 49 provides the error-processed smoothed phase difference Φ'n(J+1) of inline FT data on each slice n, to the frequency-shift alert unit 54, image-position shift unit 50 and resonant-frequency correction unit 51.

Then, at step S7 in FIG. 9, the frequency-shift alert unit 54 decides whether or not greater than a preset threshold is a desired phase-difference conversion amount, e.g. an error-processed smoothed phase difference Φ'n(J+1), of among phase-difference conversion amounts including a phase difference Δφ(i, J+1) of inline FT data obtained by the phase-difference calculating unit 44, a representative phase difference Φn(J+1) of inline FT data obtained by the representative phase-difference calculating unit 45, a phase-difference correction value Φpacn(J+1) obtained by the phase-difference correction value calculating unit 46, a smoothed phase difference Φ'n(J+1) obtained by the phase-difference smoothing unit 48 and an error-processed smoothed phase difference Φ'n(J+1) obtained by the slice-directional-error processing unit 49, according to equation (18).

$$\Phi'n(J+1)>\text{Threshold} \quad (18)$$

When decided that the smoothed phase difference Φ'n(J+1) is greater than the threshold, the frequency-shift alert unit 54 provides alert information, such as an error message, to the display device 34 and other output devices, not shown, thereby making a display or an output. The alert information may be voice information without limited to image information while the output device may be an output device such as a speaker or a printer.

Namely, the frequency-shift alert unit 54 outputs alert information when the frequency-shift amount of inline FT data exceeds a constant amount and hence there is an unignorable effect upon image taking, including fat suppression. The threshold can be set at approximately 100 [Hz] so as to decide the presence or absence of an effect upon fat suppression.

Meanwhile, at step S8, the image-position shift unit 50 reads raw data from the raw-data database 42 and shifts the phase of raw data slice by slice, depending upon the smoothed phase difference Φ'n(J+1) of inline FT data on each slice n received from the slice-directional-error processing unit 49.

Here, generally, frequency resolution differs in between the RO direction, the PE direction and the SL direction, in accordance with the sequence. Particularly, where taking an EPI image according to an EPI sequence, frequency resolution is the highest in the PE direction. For example, in the case of taking an image at an echo interval of "ets" of 0.8 ms and a PE-directional matrix size of 64, the frequency resolution is given 20 [Hz/pixel] in the PE direction, as shown in equation (19).

$$1/(0.008\times64)=20 \text{ [Hz/pixel]} \quad (19)$$

Meanwhile, generally, the frequency resolution in the RO direction one-digit lower than the frequency resolution in the PE direction wherein the amount of image positional shift based on frequency shift is one-digit smaller. Furthermore, the effect of frequency shift in the SL direction results in a shift of the slice excitation sectional plane. Where the τ length of from a 180-degree pulse to an echo is 0.8 ms, the frequency width is 1250 [Hz/slice] which is minimal in the effect of image positional shift. For this reason, the image positional shift due to a BO shift, in many cases, is predominant in amount in the PE direction rather than the image positional shift in the RO direction or in the SL direction.

Accordingly, the image-position shift unit 50 shifts the phase of raw data, slice by slice, in the PE direction, for example. In order for this, the image-position shift unit 50 converts the smoothed phase difference Φ'n(J+1) of inline FT data into a frequency shift amount ΔF of inline FT data on each slice by the use of an echo time "te", a time of from the center of an RF signal transmitted to the examination subject P to a peak of the inline FT data, as shown in equation (20).

$$\Delta F=\Phi'n(J+1)/(360\times te) \text{ [Hz]} \quad (20)$$

Herein,

ΔF: frequency shift amount

Te: echo time of inline FT data [s].

Then, the image-position shift unit 50 calculates, for each slice n, a shift amount Φcorr of raw data in the PE direction from the determined frequency shift amount ΔF of inline FT data, according to equation (21).

$$\Phi corr \text{ [degree]} = (360 \times \Delta F \times ets)/shot \quad (21)$$

Herein,
ets: echo interval of raw data.
Shot: number of excited pulse of high frequency per one EPI image Then, the image-position shift unit 50 shifts the phase of raw data on each slice n by a shift amount Φcorr in the PE direction and writes it to the raw-data database 42, thereby rearranging it in the k-space.

Note that, where the image positional shift is great in amount in the RO direction, a shift amount can be determined to provide also in the RO direction, according to equation (22).

$$\Phi corr \text{ [degree]} = 360 \times \Delta F \times (A/D \text{ sampling time}) \quad (22)$$

Due to this, the image reconstruction unit 41 at step S9 reconstructs, by Fourier transform, the phase-corrected raw data rearranged in the k-space of the raw-data database 42, and provides it to the display device 34. Thus, the display device 34 displays an image of examination subject P corrected in position by shifting in the PE and RO directions.

Meanwhile, there is a MSOFT (multi off-resonance fat suppression technique) that pre-pulse frequency is changed from slice to slice by shimming as an adjustment operation to correct for the spatial non-uniformity of static magnetic field, as one scheme of fat suppression. In the MSOFT, fat suppression is effected by adjusting the RF signal at different frequencies from slice to slice.

However, because of a change of resonant frequency in the NMR signal due to a BO shift, poor control of fat suppression arises.

Accordingly, at step S10, the resonant-frequency correction unit 51 determines, for each slice n, a frequency correction amount as to the RF signal depending upon the smoothed phase difference Φ'n(J+1) of inline FT data on each slice n received from the slice-directional-error processing unit 49, and provides a determined frequency correction amount as to the RF signal to the sequence-controller control unit 40, thereby shifting the RF signal frequency on a slice-by-slice basis.

Namely, the resonant-frequency correction unit 51 converts, for each slice n, the smoothed phase difference Φ'n (J+1) of inline FT data received from the slice-directional-error processing unit 49 into a frequency shift amount ΔF of inline FT data, and provides an obtained frequency shift amount ΔF as a frequency correction amount as to the RF signal to the sequence-controller control unit 40.

Accordingly, the sequence-controller control unit 40 serves as a real-time manager (RM) for control of sequence execution so that the sequence information can be corrected to reflect the frequency correction amount as to the RF signal upon a center frequency (CF) of the RF signal contained in the sequence during the execution of dynamic scanning.

Namely, the sequence-controller control unit 40 controls the sequence controller 31 to thereby shift, for each slice n, the frequency of the RF signal to be transmitted from the RF coil 24 to the examination subject P in accordance with the frequency shift amount ΔF.

Due to this, even when the NMR signal is changed in resonant frequency by a BO shift, the frequency of RF signal is shifted in accordance with the change amount of resonant frequency. This can improve the poor control of fat suppression.

Incidentally, there is actually a spatial non-uniformity in the shift of resonant frequency resulting from a temperature rise of the ferrous shim due to a BO shift. Nevertheless, this is comparatively small in absolute value, i.e. several tens Hz or around even in the shift of resonant frequency in the PE direction where the frequency resolution is the highest. Meanwhile, despite there is a resonant frequency distribution of nearly several tens percent on the slice plane, it is often the case that resonance frequency shift is of such values that can be approximated to nearly the same value. Accordingly, it is possible to calculate, for correction, a frequency correction amount common between the slices n.

Accordingly, the slice-common phase-difference calculating unit 47, when decided set to calculate a common shift amount of resonant frequency between the slices n at step S4, determines at step S11 a slice-common phase difference Φ(J+1) by adding, with weighting, together the representative phase difference Φn(J+1) or phase-difference correction value Φpacn(J+1) on each slice n in accordance with a signal intensity representative value Sign(J+1) or sum of signal intensity representative values Sigpacn(J+1).

Namely, the slice-common phase-difference calculating unit 47 determines a slice-common phase difference Φ(J+1) by adding, with weighting, together the representative phase difference Φn(J+1) or phase-difference correction value Φpacn(J+1) on all the slices n (0≦n≦NS-1) by means of a signal intensity representative value Sign(J+1) or sum of signal intensity representative values Sigpacn(J+1).

$$\Phi(J+1) = \frac{\sum_{n=0}^{NS-1} \{Sign(J+1) \cdot \Phi n(J+1)\}}{\sum_{n=0}^{NS-1} \{Sign(J+1)\}} \quad (23\text{-}1)$$

$$\Phi(J+1) = \frac{\sum_{n=0}^{NS-1} \{Sigpacn(J+1) \cdot \Phi pacn(J+1)\}}{\sum_{n=0}^{NS-1} \{Sigpacn(J+1)\}} \quad (23\text{-}2)$$

Then, at step S12, the phase-difference smoothing unit 48 makes error and smoothing processes of slice-common phase difference Φ(J+1) similarly to the step S5, thereby calculating a smoothed phase difference Φ'(J+1) At step S13, the frequency-shift alert unit 54 decides whether or not greater than a preset threshold is a desired phase-difference conversion amount, e.g. a smoothed phase difference Φ'(J+1), of among phase-difference conversion amounts including a phase difference Δφ(i, J+1) of inline FT data obtained by the phase-difference calculating unit 44, a representative phase difference Φn(J+1) of inline FT data obtained by the representative phase-difference calculating unit 45, a phase-difference correction value Φpacn(J+1) obtained by the phase-difference correction value calculating unit 46, a slice-common phase difference Φ(J+1) obtained by the slice-common phase-difference calculating unit 47 and a smoothed phase difference Φ(J+1) obtained by the phase-difference smoothing unit 48, according to equation (18).

When decided that the smoothed phase difference Φ'(J+1) is greater than the threshold, the frequency-shift alert unit 54 provides alert information, such as an error message, to the display device 34 and other output devices, not shown, thus making a display or output.

Meanwhile, at step S14, the image-position shift unit. 50 converts, similarly to the step S8, the slice-common smoothed phase difference Φ'(J+1) into a frequency shift amount ΔF, and reads raw data from the raw-data database 42, thereby shifting the phase of the raw data.

At step s15, the image re-construction unit 41 reconstructs, by Fourier transform, the phase-corrected raw data rearranged in the k-space of the raw-data database 42, and provides it to the display device 34, similarly to the step S9. Thus, the display device 34 displays an image of examination subject P corrected in position by a shift in the PE or RO direction.

Meanwhile, at step S16, the resonant-frequency correction unit 51 converts the slice-common smoothed phase difference Φ'(J+1) into a frequency shift amount ΔF to thereby determine a frequency correction amount of RF signal, and provides a determined frequency correction amount of RF signal to the sequence-controller control unit 40, thereby shifting the RF signal frequency on all the slices n.

Due to this, even when the NMR signal is changed in resonant frequency by a B0 shift, the frequency of RF signal is shifted in accordance with the change amount of resonant frequency. This improves the poor control of fat suppression.

According to the magnetic resonance imaging apparatus 20 as described above, it is possible to correct for the positional shift of tomographic image due to a B0 shift and to improve the poor fat suppression without greatly modifying the hardware such as a ferrous shim.

Namely, according to the magnetic resonance imaging apparatus 20, image positional correction can be made because an image positional shift amount can be calculated by determining a dynamic phase change of raw data by the magnetic resonance imaging data processing system 43 as a pre-process to reconstructing a tomographic image of the examination subject P. Furthermore, according to the magnetic resonance imaging apparatus 20, poor fat suppression can be improved because the resonant frequency can be corrected by calculating a resonant frequency shift due to a B0 shift.

On this occasion, because the shift amount of resonant frequency caused by a B0 shift can be determined from imaging raw data 70 or phase-correction raw data 71 required in nature, there is no need to gather new raw data. As a result, tomographic-image positional shift caused by a B0 shift can be corrected and poor fat suppression can be improved without increasing image-taking time and data size.

Meanwhile, according to the magnetic resonance imaging apparatus 20, because a phase difference common in the RO direction or in the slice-n direction can be calculated by the representative phase-difference calculating unit 45 or the slice-common phase-difference calculating unit 47, the phase or resonant frequency of raw data can be shifted with a constant correction value regardless of the RO direction or the slice-n direction.

Furthermore, the phase-difference correction-value calculating unit 46 can correct for the error of phase-difference conversion amount, such as representative phase difference, due to the sensitivity variations based on each surface coil 24c of the phased-array coil 24b. Besides, the phase-difference smoothing unit 48 is allowed to make error and smoothing processes in the dynamic direction while the slice-directional-error processing unit 49 is to make an error process in the slice direction. Thus, even when there is an abnormal value in the phase-difference conversion amount, it is possible to determine a frequency shift amount ΔF of resonant frequency with higher accuracy.

Meanwhile, when the phase-difference conversion amount exceeds a constant value, the frequency-shift alert unit 54 outputs alert information. Thus, it is easy to confirm the presence or absence of poor fat suppression resulting from a B0 shift.

Incidentally, in the magnetic resonance imaging apparatus 20, the RF coil 24 may use a coil other in kind than the phased-array coil 24b. Meanwhile, the magnetic resonance imaging apparatus 20 may be arranged to transfer data directly between the constituent elements without the provision of the databases. Furthermore, the magnetic resonance imaging apparatus 20 may be arranged omitting a part of the constituent elements of the magnetic resonance imaging data processing system 43 wherein information processing or calculation may be changed in order.

Meanwhile, it is possible to calculate as a phase difference conversion amount a phase difference Φn(i, J+1) of from a reference temporal aspect to a temporal phase J+1 considered on the RO-directional pixels i directly from a phase difference Δφ(i, J+1) of inline FT data obtained by the phase-difference calculating unit 44, to convert it into a frequency shift amount ΔF each for the RO-directional pixels i in the similar procedure to the representative phase difference Φn(J+1) thereby shifting the phase of raw data and the frequency of the RF signal.

In order for this, the input data in the processing by the constituent element of the magnetic resonance imaging apparatus 20 is satisfactorily a phase-difference conversion amount of among phase-difference conversion amounts including a phase difference Φn(i, J+1), a representative phase difference Φn(J+1), a representative phase difference Φn(ch, J+1) on each channel ch, a phase-difference correction value Φpacn(J+1), a smoothed phase difference Φ'n(J+1) or Φ'(J+1), an error-processed smoothed phase difference Φ'n(J+1) and a slice-common phase difference Φ(J+1), that are of from a reference temporal aspect to a temporal aspect J+1 considered as an amount obtained based on a phase difference Δφ(i, J+1) of inline FT data.

In addition, in the magnetic resonance imaging apparatus 20, the image-position shift unit 50 corrects for an image position based on a phase difference due to a B0 shift so that the resonant-frequency correction unit 51 can determine a frequency shift amount from a value obtained depending upon a B0-shift-based phase difference, thereby indirectly correcting for the static magnetic-field non-uniformity caused during dynamic collection by a shift of the frequency of an RF signal transmitted from the RF coil. However, arrangement can be made in a manner directly correcting for the static magnetic-field non-uniformity depending upon a phase difference.

For example, calculation of a correction amount for a B0 shift is made on each slice. Because this makes it possible to calculate a B0 shift amount on a slice-by-slice basis, the 0-order and 1-order components of magnetic-field non-uniformity in a slice direction can be calculated by a weighted least-square calculation with taking a signal-intensity absolute value as a weight. The 1-order component is expanded on a current value (offset value of gradient magnetic-field amplifier output) to be applied to the primary shim coil (gradient magnetic-field coil), to correct for magnetic field non-uniformity during dynamical image taking.

Incidentally, the 0-order component of magnetic field non-uniformity is to be coped with by correcting the offset amount of excitation frequency during dynamic image taking.

By providing such a correction unit as having the foregoing function to the magnetic resonance imaging apparatus 20, magnetic field non-uniformity can be directly corrected during dynamic image taking.

In case the magnetic resonance imaging apparatus 20 is provided with a correction unit having a desired function besides the correction units represented by the image-position shift unit 50 and resonant-frequency correction unit 51, direct or indirect correction is possible for the static magnetic-field non-uniformity occurring during dynamic collection.

What is claimed is:

1. A magnetic resonance imaging apparatus comprising:
a phase difference calculation unit configured to perform a one-dimensional Fourier transform on non-phase-encoded complex data extracted from complex nuclear magnetic resonant signal data collected during a dynamic EPI NMR image scanning process which also collects a complete set of image data including phase-encoded image data, and to determine a phase difference with respect to time based on a one-dimensional Fourier transform of only the extracted complex non-phase-encoded data not obtained in a pre-scanning process; and
a correction unit configured to correct said complete set of image data for non-uniformity of a static magnetic field caused by the dynamic scanning, based upon said determined phase difference.

2. A magnetic resonance imaging apparatus according to claim 1, wherein the correction unit is configured to indirectly correct for non-uniformity of the static magnetic field.

3. A magnetic resonance imaging apparatus according to claim 1, wherein the correction unit is configured to directly correct for non-uniformity of the static magnetic field.

4. A magnetic resonance imaging apparatus comprising:
a phase difference calculation unit configured to perform a one-dimensional Fourier transform on non-phase-encoded complex data extracted from complex nuclear magnetic resonant signal data collected during dynamic EPI NMR image scanning which also collects a complete set of image data including phase-encoded image data, and to determine a phase difference with respect to time based on a one-dimensional Fourier transform of only the complex non-phase-encoded data not obtained in a pre-scanning process; and
an image position shift unit configured to correct said complete set of image data for image position based upon said determined phase difference.

5. A magnetic resonance imaging apparatus according to claim 4, wherein the image position shift unit is configured to correct for image position by determining a frequency shift amount based on said determined phase difference and a phase shift of the complex data.

6. A magnetic resonance imaging apparatus according to claim 4, further including a representative phase difference calculation unit configured to perform a weighted addition depending upon signal intensities, of pixels in a read-out direction.

7. A magnetic resonance imaging apparatus according to claim 4, further including a phase difference correction value calculation unit configured to perform a correction process for an error based on a phase difference caused by sensitivity variations between surface coils of a phased array coil used as an MRI RF coil.

8. A magnetic resonance imaging apparatus according to claim 4, further including a phase difference smoothing unit configured to perform a smoothing process based on said determined phase difference by use of a running mean value.

9. A magnetic resonance imaging apparatus according to claim 4, further including a phase difference smoothing unit performing an error correction process by excluding a value based on said determined phase difference being outside a preset threshold, and performing a smoothing process based on the phase difference by use of a running mean value.

10. A magnetic resonance imaging apparatus according to claim 4, further including a slice-directional-error processing unit configured to perform an error correction process by detecting as an abnormal value a value exceeding a predetermined limit value based on a phase difference associated with each slice and replacing the abnormal value with a value obtained based on a normal phase difference expected for that slice.

11. A magnetic resonance imaging apparatus according to claim 4, further including a slice-common phase difference calculation unit for summing up weighted values based on the phase differences of slices depending upon slice signal intensities.

12. A magnetic resonance imaging apparatus according to claim 4, further including a frequency shift alert unit for providing alert information to an output device when the value based on the determined phase difference exceeds a preset threshold.

13. A magnetic resonance imaging apparatus according to claim 4, wherein the non-phase-encoded complex data is provided as complex NMR image data used for imaging and located in k-space to include a k-space center.

14. A magnetic resonance imaging apparatus according to claim 4, further including a resonant frequency correction unit for determining a frequency shift amount based on the phase difference and frequency shift of an RF signal to be transmitted from the RF coil.

15. A magnetic resonance imaging apparatus comprising:
a phase difference calculation unit configured to perform a one-dimensional Fourier transform on non-phase-encoded complex data extracted from nuclear magnetic resonant signal data collected during dynamic EPI NMR image scanning which also collects a complete set of image data including phase-encoded image data, and determining a phase difference for said complete set of image data with respect to time based on a one-dimensional Fourier transform of only the non-phase-encoded complex data not obtained in a pre-scanning process; and
a resonant frequency correction unit for determining a frequency shift based on the phase difference and frequency shift of an RF signal to be transmitted from an MRI RF coil.

16. A magnetic resonance imaging apparatus according to claim 15, further including a representative phase difference calculation unit configured to perform a weighted addition, depending upon signal intensities, of pixels in a read out direction.

17. A magnetic resonance imaging apparatus according to claim 15, further including a phase difference correction value calculation unit configured to perform an error correction process based on the phase difference caused by sensitivity variations between surface coils of a phased array coil used as an MRI RF coil.

18. A magnetic resonance imaging apparatus according to claim 15, further including a phase difference smoothing unit configured to perform a smoothing process based on the phase difference by use of a running mean value.

19. A magnetic resonance imaging apparatus according to claim 15, further including a phase difference smoothing unit performing an error correction process by excluding a value based on the phase difference being outside a preset threshold, and performing a smoothing process based on the phase difference by use of a running mean value.

20. A magnetic resonance imaging apparatus according to claim 15, further including a slice-directional-error processing unit configured to perform an error correction process by detecting an abnormal value based on a phase difference associated with each slice beyond a predetermined limit and replacing the abnormal value with a value obtained based on a normal phase difference expected for that slice.

21. A magnetic resonance imaging apparatus according to claim 15, further including a slice-common phase difference calculation unit for summing up weighted values based on the slice phase differences by weighting depending upon slice signal intensities.

22. A magnetic resonance imaging apparatus according to claim 15, further including a frequency shift alert unit for providing alert information to an output device when the phase difference value exceeds a preset threshold.

23. A magnetic resonance imaging apparatus according to claim 15, wherein the non-phase-encoded complex data is provided as complex NMR image data for use in MR imaging and including complex image data located at a k-space center.

24. A magnetic resonance imaging data processing method comprising:
   performing a one-dimensional Fourier transform on non-phase-encoded complex data extracted from complex nuclear magnetic resonant signal data collected during dynamic EPI NMR image scanning which also collects a complete set of image data including phase-encoded image data;
   determining a phase difference with respect to time based on a one-dimensional Fourier transform of only the non-phase-encoded complex data not obtained in a pre-scanning process; and
   correcting said complete set of image data for non-uniformity of static magnetic field, based upon the determined phase difference.

25. A magnetic resonance imaging data processing method comprising:
   performing a one-dimensional Fourier transform on non-phase-encoded complex data extracted from complex nuclear magnetic resonant signal data collected during dynamic EPI scanning which also collects a complete set of image data including phase-encoded image data;
   determining a phase difference with respect to time based on a one-dimensional Fourier transform of only the non-phase-encoded complex data not obtained in a pre-scanning process; and
   correcting said complete set of image data for image position based upon the determined phase difference.

26. A magnetic resonance imaging data processing method comprising:
   performing a one-dimensional Fourier transform on non-phase-encoded complex data extracted from complex nuclear magnetic resonant signal data collected during dynamic EPI scanning which also collects a complete set of image data including phase-encoded image data;
   determining a phase difference with respect to time based on a one-dimensional Fourier transform of only the non-phase-encoded complex data not obtained in a pre-scanning process;
   determining a frequency shift based on the determined phase difference;
   determining an RF frequency correction amount of an RF signal to be transmitted from an RF coil depending upon the determined frequency shift; and
   correcting sequence information for said complete set of image data based upon a determined RF frequency correction amount.

27. A magnetic resonance imaging apparatus comprising:
   a phase difference calculation unit configured to perform a one-dimensional Fourier transform on non-phase-encoded complex data extracted from complex nuclear magnetic resonant signal data collected during dynamic scanning according to an echo planar imaging (EPI) sequence which also collects a complete set of image data including phase-encoded image data, and to determine a phase difference with respect to time based on a one-dimensional Fourier transform of only the non-phase-encoded complex data not obtained in a pre-scanning process; and
   a correction unit configured to correct said complete set of image data for non-uniformity of static magnetic field caused by dynamic scanning, based upon the determined phase difference.

28. A magnetic resonance imaging apparatus comprising:
   a phase difference calculation unit configured to perform a one-dimensional Fourier transform on non-phase-encoded complex data extracted from complex nuclear magnetic resonant signal data collected during dynamic scanning according to an echo planar imaging sequence which also collects a complete set of image data including phase-encoded image data, and to determine a phase difference with respect to time based on a one-dimensional Fourier transform of only the non-phase-encoded complex data not obtained in a pre-scanning process; and
   an image position shift unit configured to correct said complete set of image data for image position based upon the determined phase difference.

29. A magnetic resonance imaging apparatus comprising:
   a phase difference calculation unit configured to perform a one-dimensional Fourier transform on non-phase-encoded complex data extracted from complex nuclear magnetic resonant signal data collected during dynamic scanning according to an echo planar imaging sequence which also collects a complete set of image data including phase-encoded image data, and to determine a phase difference for said complete set of image data with respect to time based on a one-dimensional Fourier transform of only the non-phase-encoded complex data not obtained in a pre-scanning process; and
   a resonant frequency correction unit for determining a frequency shift amount based on the determined phase difference and shifting an RF signal frequency to be transmitted from an RF coil.

30. A magnetic resonance imaging data processing method comprising:
   performing a one-dimensional Fourier transform on non-phase-encoded complex data extracted from complex nuclear magnetic resonant signal data collected during dynamic scanning according to an echo planar imaging sequence which also collects a complete set of image data including phase-encoded image data;
   determining a phase difference with respect to time based on a one-dimensional Fourier transform of only complex non-phase-encoded data not obtained in a pre-scanning process; and correcting said complete set of image data for non-uniformity of static magnetic field caused by dynamic scanning, based upon the determined phase difference.

31. A magnetic resonance imaging data processing method comprising:
performing a one-dimensional Fourier transform on non-phase-encoded complex data extracted from complex nuclear magnetic resonant signal data collected during dynamic scanning according to an echo planar imaging sequence which also collects a complete set of image data including phase-encoded image data;
determining a phase difference with respect to time based on a one-dimensional Fourier transform of only the non-phase-encoded complex data not obtained in a pre-scanning process; and
correcting said complete set of image data for image position based upon the determined phase difference.

32. A magnetic resonance imaging data processing method comprising:
performing a one-dimensional Fourier transform on non-phase-encoded complex data extracted from complex nuclear magnetic resonant signal data collected during dynamic scanning according to an echo planar imaging sequence which also collects a complete set of image data including phase-encoded image data;
determining a phase difference with respect to time based on a one-dimensional Fourier transform of only the non-phase-encoded complex data not obtained in a pre-scanning process;
determining a frequency shift amount based on the determined phase difference;
determining a correction for an RF signal frequency to be transmitted from the RF coil depending upon a determined frequency shift amount; and
correcting sequence information for said complete set of image data based upon a determined RF signal frequency correction amount.

33. A magnetic resonance imaging apparatus comprising:
a phase difference calculation unit configured to perform a Fourier transform on non-phase-encoded complex data extracted from complex nuclear resonant signal image data collected during an EPI dynamic scan which also collects a complete set of image data including phase-encoded image data and to determine a phase difference with respect to time for said complete set of image data based on a Fourier transform of only the non-phase-encoded complex data not obtained in a pre-scanning process; and
a correction unit configured to correct said complete set of image data for non-uniformity of static magnetic field depending upon the determined phase difference.

34. A magnetic resonance imaging apparatus comprising:
a phase difference calculation unit configured to perform a Fourier transform on non-phase-encoded complex data extracted from complex nuclear magnetic resonant signal image data collected during an EPI dynamic scan which also collects a complete set of image data including phase-encoded image data and to determine a phase difference for said complete set of image data with respect to time based on a Fourier transform of only the non-phase-encoded complex data not obtained in a pre-scanning process; and
an image position shift unit configured to correct said complete set of image data for image position depending upon the determined phase difference.

35. A magnetic resonance imaging apparatus comprising:
a phase difference calculation unit configured to perform a Fourier transform on non-phase-encoded complex data extracted from complex nuclear resonant signal image data collected during an EPI dynamic scan which also collects a complete set of image data including phase-encoded image data and to determine a phase difference for said complete set of image data with respect to time based on a Fourier transform of only the non-phase-encoded complex data not obtained in a pre-scanning process; and
a resonant frequency correction unit for determining a frequency shift amount for said complete set of image data based on the determined phase difference and shifting an RF signal frequency to be transmitted from an RF coil.

36. A magnetic resonance imaging data processing method comprising:
performing a Fourier transform on non-phase-encoded complex data extracted from complex nuclear magnetic resonant signal image data collected during an EPI dynamic scan which also collects a complete set of image data including phase-encoded image data;
determining a phase difference with respect to time for said complete set of image data based on a Fourier transform of only the non-phase-encoded complex data not obtained in a pre-scanning process; and
correcting said complete set of image data for non-uniformity of static magnetic field depending upon the determined phase difference.

37. A magnetic resonance imaging data processing method comprising:
performing a Fourier transform on non-phase-encoded complex data extracted from complex nuclear magnetic resonant signal image data collected during an EPI dynamic scan which also collects a complete set of image data including phase-encoded image data;
determining a phase difference for said complete set of image data with respect to time based on a Fourier transform of only the non-phase-encoded complex data not obtained in a pre-scanning process; and
correcting said complete set of image data for image position based upon the determined phase difference.

38. A magnetic resonance imaging data processing method comprising:
performing a Fourier transform on non-phase-encoded complex data extracted from complex nuclear magnetic resonant signal image data collected during an EPI dynamic scan which also collects a complete set of image data including phase-encoded image data;
determining a phase difference with respect to time for said complete set of image data based on a Fourier transform of only the non-phase encoded complex data not obtained in a pre-scanning process;
determining a frequency shift amount based on the determined phase difference;
determining a correction for an RF signal frequency to be transmitted from an RF coil depending upon a determined frequency shift amount; and
correcting sequence information for said complete set of image data based upon a determined frequency RF signal frequency correction.

* * * * *